US007888729B2

(12) United States Patent
Cheng et al.

(10) Patent No.: US 7,888,729 B2
(45) Date of Patent: Feb. 15, 2011

(54) FLASH MEMORY GATE STRUCTURE FOR WIDENED LITHOGRAPHY WINDOW

(75) Inventors: Kangguo Cheng, Guilderland, NY (US);
Lawrence A. Clevenger, LaGrangeville, NY (US); Timothy J. Dalton, Ridgefield, CT (US); Louis L. Hsu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 276 days.

(21) Appl. No.: 12/198,345

(22) Filed: Aug. 26, 2008

(65) Prior Publication Data

US 2010/0052034 A1 Mar. 4, 2010

(51) Int. Cl.
*H01L 21/336* (2006.01)
(52) U.S. Cl. .................. 257/316; 257/315; 257/314; 257/E21.422; 438/266
(58) Field of Classification Search ......... 257/314–326, 257/E29.3, E21.244; 438/266
See application file for complete search history.

(56) References Cited

U.S. PATENT DOCUMENTS

| 5,899,713 | A | 5/1999 | Acocella et al. |
| 6,052,311 | A | 4/2000 | Fu |
| 6,424,001 | B1 | 7/2002 | Forbes et al. |
| 6,451,652 | B1 * | 9/2002 | Caywood et al. ............ 438/257 |
| 6,809,372 | B2 | 10/2004 | Gambino et al. |
| 7,064,377 | B2 | 6/2006 | Hagemeyer et al. |
| 2006/0063331 | A1 | 3/2006 | Park et al. |
| 2006/0128099 | A1 | 6/2006 | Kim et al. |
| 2007/0001213 | A1 | 1/2007 | Om et al. |
| 2007/0122976 | A1 | 5/2007 | Kim |
| 2007/0241386 | A1 | 10/2007 | Wang et al. |

FOREIGN PATENT DOCUMENTS

KR 20010011848 2/2001

OTHER PUBLICATIONS

U.S. Appl. No. 12/120,413, entitled "Anti-Reflection Structures for CMOS Image Sensors", filed May 14, 2008, First Named Inventor: James W. Adkisson.

* cited by examiner

*Primary Examiner*—Thinh T Nguyen
(74) *Attorney, Agent, or Firm*—Scully, Scott, Murphy & Presser, P.C.; Louis J. Percello, Esq.

(57) ABSTRACT

A first portion of a semiconductor substrate belonging to a flash memory device region is recessed to a recess depth to form a recessed region, while a second portion of the semiconductor substrate belonging to a logic device region is protected with a masking layer. A first gate dielectric layer and a first gate conductor layer formed within the recessed region such that the first gate conductive layer is substantially coplanar with the top surfaces of the shallow trench isolation structures. A second gate dielectric layer, a second gate conductor layer, and a gate cap hard mask layer, each having a planar top surface, is subsequently patterned. The pattern of the gate structure in the flash memory device region is transferred into the first gate conductor layer and the first gate dielectric layer to form a floating gate and a first gate dielectric, respectively.

13 Claims, 18 Drawing Sheets

FLASH MEMORY GATE STRUCTURE FOR WIDENED LITHOGRAPHY WINDOW

FIELD OF THE INVENTION

The present invention relates to semiconductor devices, and particularly, to a semiconductor structure including a flash memory device, and methods of manufacturing the same.

BACKGROUND OF THE INVENTION

A flash memory device is programmable non-volatile semiconductor memory device. The flash memory device is used in many semiconductor devices including universal serial bus (USB) flash devices for data storage and transfer. A field effect transistor including a floating gate and a control gate comprises a core of a unit cell of the flash memory device. Continual scaling of the unit cell of the flash memory has led to increased memory density for semiconductor chips including the flash memory device.

A non-volatile memory cell such as flash memory using a floating gate to conduct programmability suffers a non-planarization problem. Specifically, the presence of two gate electrodes, i.e., a control gate and a floating gate, makes the integration of a flash memory device with other field effect transistors comprising a logic circuit, such as a peripheral circuit that supports the operation of an array of flash memory cells, difficult. This is because the floating gate element which is added to the flash memory device causes the physical structure of the flash memory device to be higher than other regular complementary metal-oxide-semiconductor (CMOS) devices that do no include the floating gate element. The floating gate is needed only for the flash memory device, and is not needed for logic transistors. Formation of a material layer for the floating gate induces differences in material stack heights between the flash memory array region and a logic device region, inducing a significant variation in topography of the top surface of the material stacks that need to be lithographically patterned.

Surface topography, i.e., variations in the height of a surface, reduces lithographic processing window because all lithography tools have a finite depth of focus, i.e., a vertical range of height that produces a well defined lithographic image. Surface topography effectively reduces the usable focus of depth of a lithography tool because the height of the bottom surface of the photoresist varies with the surface topography of an underlying structure. The inherent non-planar surface topography in a semiconductor chip including flash memory devices and regular CMOS devices results in higher processing cost, lower reliability, a larger chip size, and/or poor performance. In order to scale down a semiconductor chip in a manufacturable manner, the surface topography of a semiconductor chip needs to be minimized during the processing steps in manufacturing.

Prior art methods for reducing surface topography in planar flash memory cell structures have been known, each with its own drawbacks. For example, U.S. Pat. No. 6,424,001 to Forbes et al. discloses methods for making a flash memory device having a very thin vertical floating gate structure located on a sidewall of a vertical transistor. Unconventional processing steps are required for formation of the vertical transistor, and integration with standard CMOS devices is not straightforward.

U.S. Pat. No. 6,809,372 to Gambino et al. discloses a flash memory cell structure employing a sidewall floating gate. Because the floating gate of this flash memory cell structure is located on a sidewall of the device, the area of this flash memory cell structure is greater than the area of a conventional stacked floating structure employing a comparable gate length.

U.S. Pat. No. 7,064,377 to Hagemeyer et al. discloses a flash memory cell having a buried floating gate. The programmable read-only memory cell comprises a floating gate located in a trench. An epitaxial channel layer formed over the floating gate. This flash memory cell structure requires many processing steps that do not belong to conventional CMOS processing steps, which increase manufacturing cost.

A similar approach is disclosed in U.S. Pat. No. 6,052,311 to Fu, in which a floating gate is buried underneath the channel of a field effect transistor. In addition to requiring many additional processing steps, the trench may cause high-stress in the substrate. Further, a high overlapping capacitance between source/drain junctions and the floating gate element may degrade performance of the flash memory cell.

In view of the above, there exists a need for a flash memory device structure that provides a planar surface for lithographic patterning of gate structures including the floating gate, and methods of manufacturing the same economically and without incurring an excessive number of additional processing steps.

SUMMARY OF THE INVENTION

The present invention addresses the needs described above by providing a recessed region on the surface of a semiconductor substrate that has substantially the same recess depth as the thickness of a floating gate so that a hard mask layer for patterning gate electrodes has a substantially planar surface.

In the present invention, a first portion of a semiconductor substrate belonging to a flash memory device region is recessed to a recess depth to form a recessed region, while a second portion of the semiconductor substrate belonging to a logic device region is protected with a masking layer. A first gate dielectric layer is formed on the recessed semiconductor surface in the flash memory device region. A first gate conductor layer is deposited and planarized employing the top surfaces of shallow trench isolation structures as a stopping layer.

The remaining portion of the first gate conductive layer within the recessed region has a top surface that is substantially coplanar with the top surfaces of the shallow trench isolation structures. A second gate dielectric layer, a second gate conductor layer, and a gate cap hard mask layer, each having a planar top surface, is subsequently formed and lithographically patterned. The planar top surface of the gate cap hard mask layer enables utilization of a full range of depth of focus of the lithographic process, facilitating the manufacturing of the semiconductor structure.

A block mask is applied and patterned to cover the logic device region, and the pattern of the gate structure in the flash memory device region is transferred into the first gate conductor layer and the first gate dielectric layer to form a floating gate and a first gate dielectric, respectively. Source and drain regions are formed by ion implantation to provide a transistor with a single gate in the logic device region and a flash memory device in the flash memory device region.

According to an aspect of the present invention, a semiconductor structure is provided, which comprises:

at least one shallow trench isolation (STI) structure having an STI top surface that is coplanar with a first top surface of a semiconductor substrate; and a transistor located on a second top surface of the semiconductor substrate and including a source region and a drain region located within the semiconductor substrate and a vertical stack of a first gate dielectric, a floating gate, a second gate dielectric, and a gate electrode, wherein the vertical stack abuts the second top surface, and wherein a top surface of the floating gate is substantially coplanar with the first top surface.

In one embodiment, a bottom surface of the source region and a bottom surface of the drain region are located above a level of a bottom surface of the at least one STI structure.

In another embodiment, the semiconductor structure further comprises a pair of dielectric STI spacers, each laterally abutting a sidewall of the at least one STI structure.

In even another embodiment, the semiconductor structure further comprises a dielectric gate spacer laterally abutting and laterally surrounding the vertical stack of the first gate dielectric, the floating gate, the second gate dielectric, and the gate electrode, wherein the dielectric gate spacer and the pair of dielectric STI spacers have a same composition.

In yet another embodiment, the dielectric gate spacer and the pair of dielectric STI spacers are of integral and unitary construction.

In still another embodiment, the source-side metal semiconductor alloy portion and the drain-side metal semiconductor alloy portion are located underneath a level of the first top surface.

In still yet another embodiment, a vertical distance between the top surface of the at least one STI structure and a bottom surface of the at least one STI surface is greater than the sum of a height of the pair of dielectric STI spacers and a thickness of the source region or the drain region.

In a further embodiment, the semiconductor structure further comprises another transistor located on the first top surface of the semiconductor substrate and including another source region and another drain region located within the semiconductor substrate and another vertical stack of a third gate dielectric and another gate electrode, wherein the other vertical stack abuts the first top surface.

According to another aspect of the present invention, a method of forming a semiconductor structure is provided, which comprises:

forming at least one shallow trench isolation (STI) structure in a semiconductor substrate;

forming a first region having a first top surface of the semiconductor substrate and a second region having a second top surface of the semiconductor substrate, wherein the second top surface is located below a level of the first top surface;

forming a first gate dielectric layer directly on the second top surface in the second region;

forming a first gate conductor layer having a top surface that is coplanar with an STI top surface directly on the first gate dielectric layer in the second region;

forming a stack of a second gate dielectric layer and a second gate conductor layer directly on the first gate conductor layer; and patterning the second gate conductor layer, the second gate dielectric layer, the first gate electrode layer, and the first gate dielectric layer.

In one embodiment, the method further comprises forming a vertical stack of a first gate dielectric, a floating gate, a second gate dielectric, and a gate electrode, wherein the first gate dielectric is a remaining portion of the first gate dielectric layer, the floating gate is a remaining portion of the first gate conductor layer, the second gate dielectric is a remaining portion of the second gate dielectric layer, and wherein the gate electrode is a remaining portion of the second gate electrode layer.

In another embodiment, the method further comprises forming another vertical stack of a third gate dielectric and another gate electrode directly on the first top surface of the semiconductor substrate, wherein the first top surface is substantially coplanar with the STI top surface.

In yet another embodiment, the method further comprises:

forming a first dielectric gate spacer laterally abutting the vertical stack of the first gate dielectric, the floating gate, the second gate dielectric, and the gate electrode; and forming a second dielectric gate spacer laterally abutting and laterally surrounding the other vertical stack of the third gate dielectric and the other gate electrode, wherein the first and second dielectric gate spacers have a same composition, wherein a topmost portion of the first gate dielectric and a topmost portion of the second gate dielectric are located at a substantially same height, and wherein the first dielectric gate spacer vertically abuts the second top surface and the second dielectric gate spacer vertically abuts the first top surface.

In still another embodiment, the method further comprises:

forming a pair of dielectric STI spacers, each laterally abutting a sidewall of the at least one STI structure and vertically abutting the second top surface, wherein the first dielectric gate spacer and the pair of dielectric STI spacers are integrally formed;

forming a source region directly underneath a first portion of the second top surface within a first opening surrounded by the first dielectric gate spacer and one of the pair of dielectric STI spacers;

forming a drain region directly underneath a second portion of the second top surface within a second opening surrounded by the first dielectric gate spacer and the other of the pair of dielectric STI spacers;

forming a source-side metal semiconductor alloy portion directly on the source region; and forming a drain-side metal semiconductor alloy portion directly on the drain region, wherein the first dielectric gate spacer and the pair of dielectric STI spacers laterally abut and laterally surround each of the source-side metal semiconductor alloy portion and the drain-side metal semiconductor alloy portion.

DETAILED DESCRIPTION OF THE INVENTION

Figure 1:
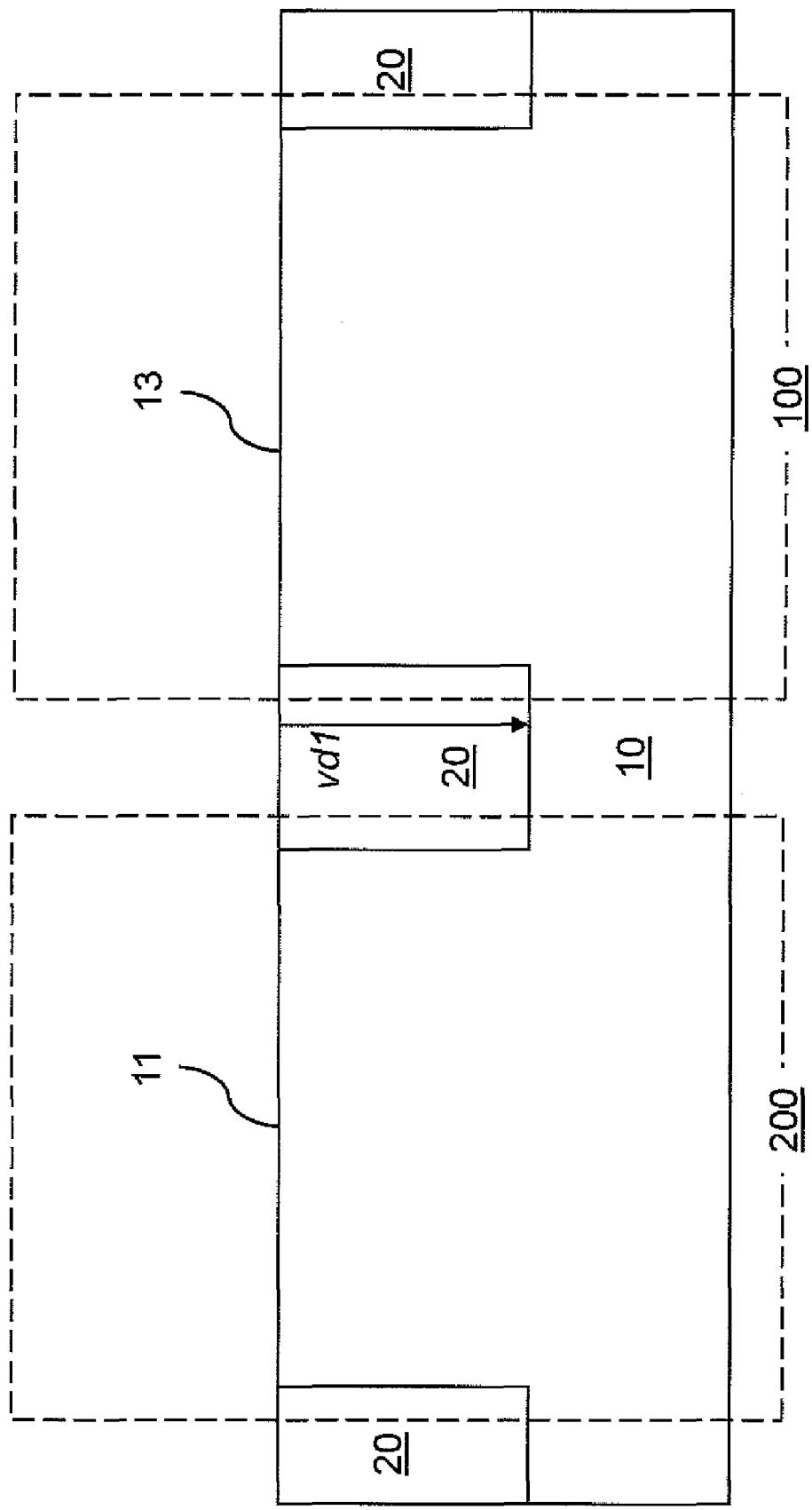
FIGS. 1-10 and 13 are sequential vertical cross-sectional views of a first exemplary semiconductor structure according to a first embodiment of the present invention at various stages of a manufacturing sequence.

As stated above, the present invention relates to a semiconductor structure including a flash memory device, and methods of manufacturing the same, which are described herein with accompanying figures. As used herein, when introducing elements of the present invention or the preferred embodiments thereof, the articles "a" "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Referring to FIG. 1, a first exemplary semiconductor structure comprises a semiconductor substrate including a semiconductor layer 10 and at least one shallow trench isolation structure 20. The semiconductor layer 10 comprises a semiconductor material. Preferably, the semiconductor material comprises a single crystalline semiconductor material having an epitaxial alignment among atoms within the entirety of the top semiconductor layer. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. For example, the semiconductor material may comprise single crystalline silicon. Various portions of the semiconductor layer 10 may be doped appropriately for optimal device performance with p-type dopants and/or n-type dopants.

At least one shallow trench isolation structure 20 is formed by lithographically patterning trenches that laterally surround top portions of the semiconductor layer 10 and by filling the trenches with a dielectric material. The excess dielectric material above the top surface of the semiconductor layer 10 is removed by planarization. The first exemplary semiconductor structure includes a first region 100 that contains a second top portion of the semiconductor layer 10 and a second region 200 that contains a first top portion of the semiconductor layer 10. The first top portion has a prototypical second top surface 13. The second top portion has a first top surface 11. The first top surface 11 and the prototypical second top surface are coplanar with the top surface of the at least one shallow trench isolation structure. The first region 100 may be a flash memory device region in which at least one flash memory device is subsequently formed. The second region 200 may be a logic device region in which at least one metal-oxide-semiconductor field effect transistor (MOSFET) is subsequently formed.

Each of the first top portion and the second top portion is laterally surrounded by the at least one shallow trench isolation (STI) structure 20. The thickness, or the height, of the at least one shallow trench isolation structure 20 is herein represented by a first vertical distance vd1 between a top surface of the at least one STI structure and a bottom surface of the at least one STI structure. The first vertical distance vd1 is selected to exceed the sum of the depth of vertical recess to be subsequently performed on the prototypical second top surface 13 in the first region 100 and the depth of source and drain regions to be subsequently formed beneath the recessed surface in the first region. The first vertical distance vd1 may be from about 300 nm to about 2.0 μm, although lesser and greater first vertical distances vd1 are also contemplated herein.

Figure 2:
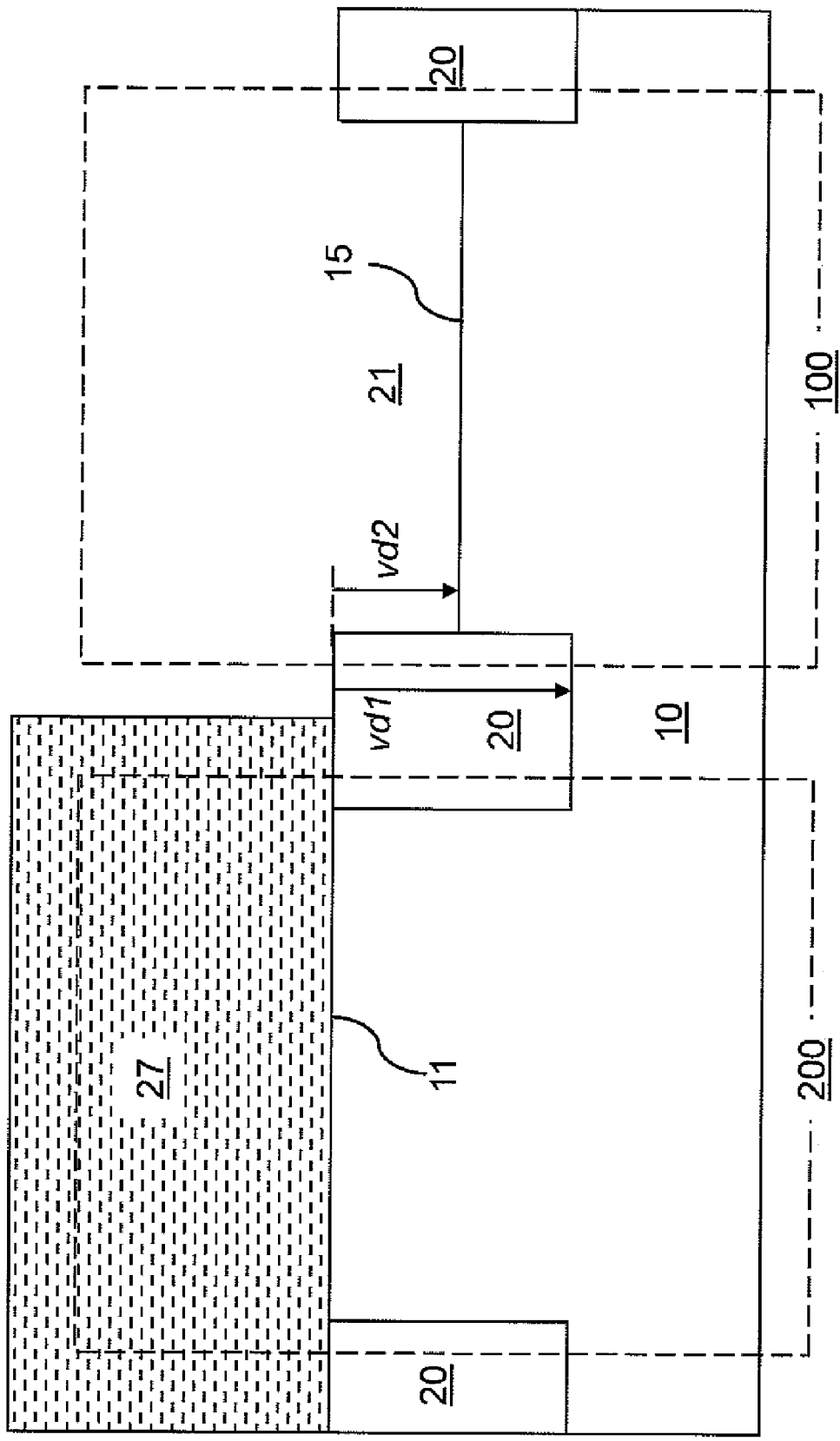

Referring to FIG. 2, a block mask 27 is applied to the top surfaces of the semiconductor layer 10 and is lithographically patterned to cover the second region 200, while exposing the first region 100. The block mask 27 may be a soft mask such as a photoresist, or may be a hard mask comprising a dielectric material such as silicon nitride or silicon oxide. The prototypical second top surface 13 in the first region 100 is vertically recessed by a recess etch by a recess depth, which is herein referred to as a second vertical distance vd2. The recess etch removes the semiconductor material of the semiconductor layer 10 in the first region 100 down to the level of a second top surface 15, which is located at the depth of the second vertical distance vd2 from the original top surfaces of the semiconductor layer 10, i.e., from the first top surface 11 and the top surface of the at least one STI structure 20. A trench 21 is formed over the second top surface 15 in the first region 100. The second recess depth is substantially equal to the sum of the thickness of a first gate dielectric layer and a first gate conductor layer to be subsequently formed within the trench 100. The second vertical distance vd2 may be from about 200 nm to about 1.0 μm, although lesser and greater second vertical distances vd2 are also contemplated herein.

The recess etch may be a dry etch process such as a plasma etch, a reactive ion etch (RIE), or a chemical downstream etch (CDE). Alternately or in combination, the recess etch may be a wet etch process with an etchant containing, for example, a mix of hydrofluoric acid and nitric acid. The recessed depth, i.e., the second vertical distance vd2, is may be tuned by controlling the duration of the etch process. The uniformity of the recess depth may be within +/−5% of the nominal value of the second vertical distance vd2 within across the entirety of the semiconductor substrate and among a plurality of semiconductor substrate that are processed sequentially. The block mask 27 is subsequently removed.

Figure 3:
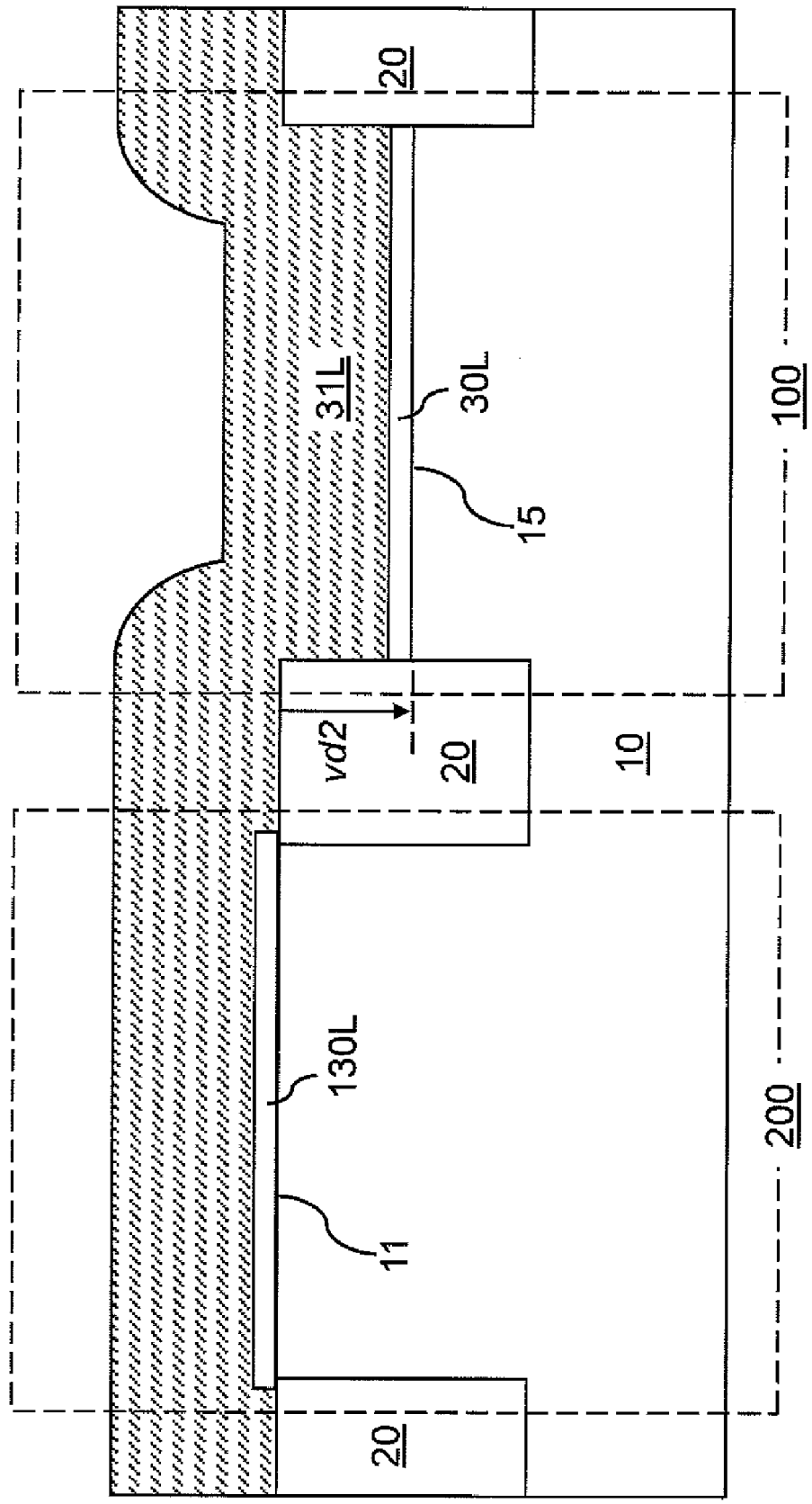

Referring to FIG. 3, gate dielectric layers are formed on the exposed semiconductor surfaces including the first top surface 11 and the second top surface 15 of the semiconductor layer 10. Specifically, a first gate dielectric layer 30L is formed directly on the second top surface 15 in the first region 100, and another first gate dielectric layer 130L is formed directly on the first top surface 11 in the second region 200.

The first gate dielectric layer 30L and the other first gate dielectric layer 130L may comprise a semiconductor-based dielectric material such as silicon oxide, silicon nitride, silicon oxynitride, and/or a stack thereof. The semiconductor-based dielectric material may be formed by thermal conversion of exposed portions of the semiconductor layer 10 and/or by chemical vapor deposition (CVD). Alternately, the first gate dielectric layer 30L and the other first gate dielectric layer 130L may comprise a high-k dielectric material such as $HfO_2$, $ZrO_2$, $La_2O_3$, $Al_2O_3$, $TiO_2$, $SrTiO_3$, $LaAlO_3$, $Y_2O_3$, an alloy thereof, and a silicate thereof. The high-k dielectric material may be formed by methods well known in the art including, for example, a chemical vapor deposition (CVD), an atomic layer deposition (ALD), molecular beam epitaxy (MBE), pulsed laser deposition (PLD), liquid source misted chemical deposition (LSMCD), physical vapor deposition (PVD), etc.

The thickness of the first gate dielectric layer 30L and the other first gate dielectric layer 130L may be from about 1 nm to about 6 nm in the case of a conventional dielectric material, and from about 2 nm to about 12 nm in the case of the high-k dielectric material. The first gate dielectric layer 30L and the other first gate dielectric layer 130L do not abut each other if the first gate dielectric layer 30L and the other first gate dielectric layer 130L are formed only by conversion of the exposed portions of the semiconductor layer 10. The first gate dielectric layer 30L and the other first gate dielectric layer 130L may be of integral and unitary construction, i.e., is a single contiguous structure, if the first gate dielectric layer 30L and the other first gate dielectric layer 130L are formed by deposition of an additional dielectric material.

A conductive material layer 31L having a thickness greater than the second vertical distance vd2 is deposited on the top surfaces of the first exemplary semiconductor structure. The conductive material layer 31L comprises a conductive material such as a doped semiconductor material, a conductive metallic nitride, a metallic material, or a combination thereof. Exemplary doped semiconductor materials include doped polysilicon, a doped silicon-containing semiconductor alloy, silicon nanocrystals, germanium nanocrystals, etc. Exemplary conductive metallic nitrides include, but are not limited to, TaN, TiN, WN, TiAlN, TaCN, other conductive refractory metal nitrides, or alloys thereof. Exemplary metallic materials include elemental metals and intermetallic alloys. The thickness of the conductive material layer 31L, as measured from below a planar portion of the top surface of the conductive material layer 31L, may be from about 200 nm to about 1,500 nm, although lesser and greater thicknesses are also contemplated herein explicitly. The entirety of the cavity 21 beneath the top surface of the at least one STI structure 20 is filled with the combination of the first gate dielectric layer 30L and the conductive material layer 31L.

Figure 4:
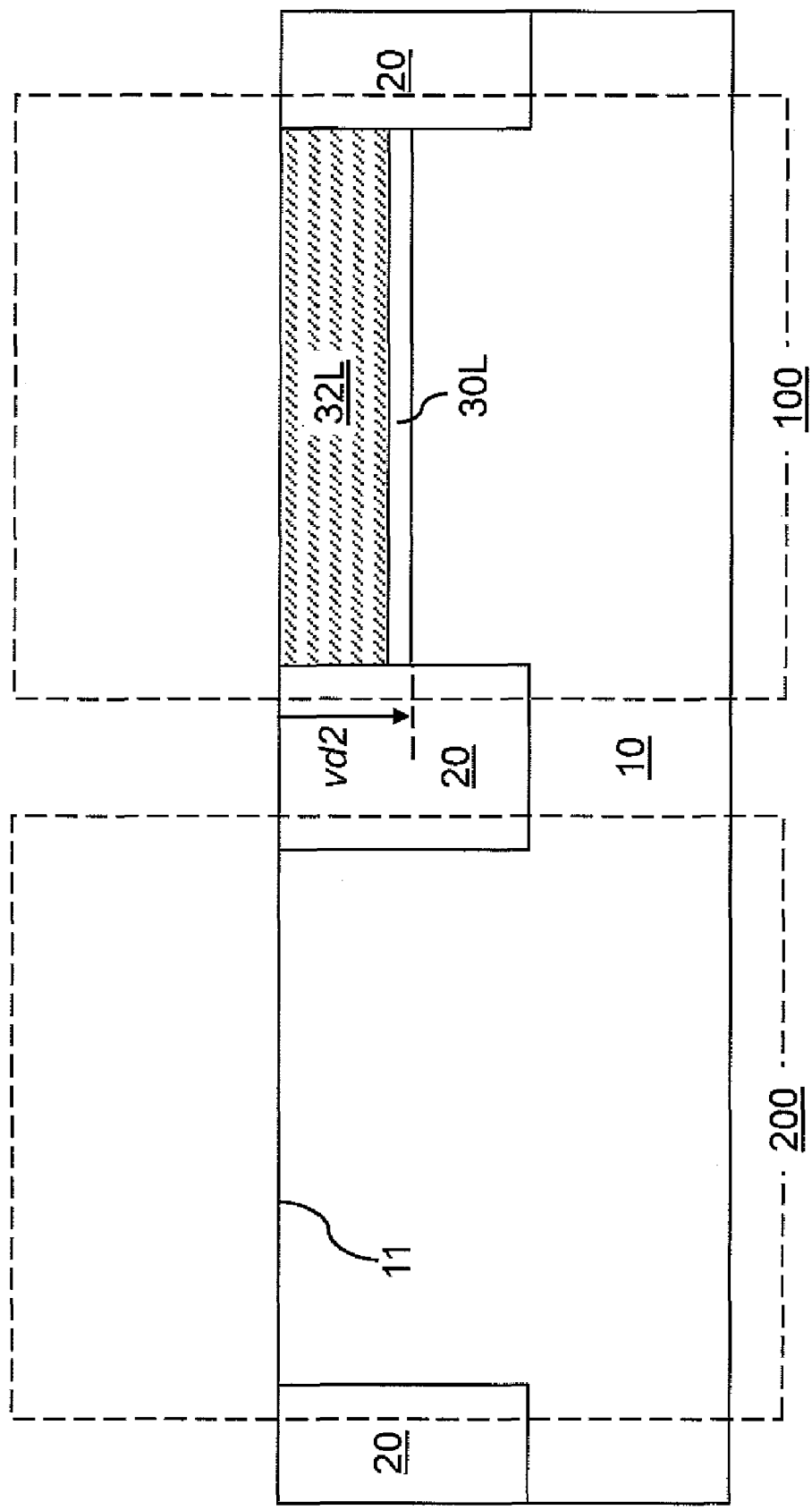

Referring to FIG. 4, the conductive material layer 31L is planarized employing an STI top surface, i.e., the top surface of the at least one STI structure 20, as a stopping layer. The conductive material layer 31L is removed from above the STI top surface and the first top surface 11 in the second region 200. The remaining portion of the conductive material layer 31L in the first region 100 constitutes a first gate conductor layer 32L. The sum of the thickness of the first gate conductor layer 32L and the thickness of the first gate dielectric layer 30L is substantially the same as the second vertical distance vd2. The other first gate dielectric layer 130L in the second region 200 may be removed during the planarization process. Alternately, the other first gate dielectric layer 130L may be removed after the planarization process by an etch, which may be an isotropic etch or an anisotropic etch. All of the exposed top surfaces of the first exemplary semiconductor structure are coplanar at this step. The exposed top surfaces of the first exemplary semiconductor structure may be cleaned.

Figure 5:
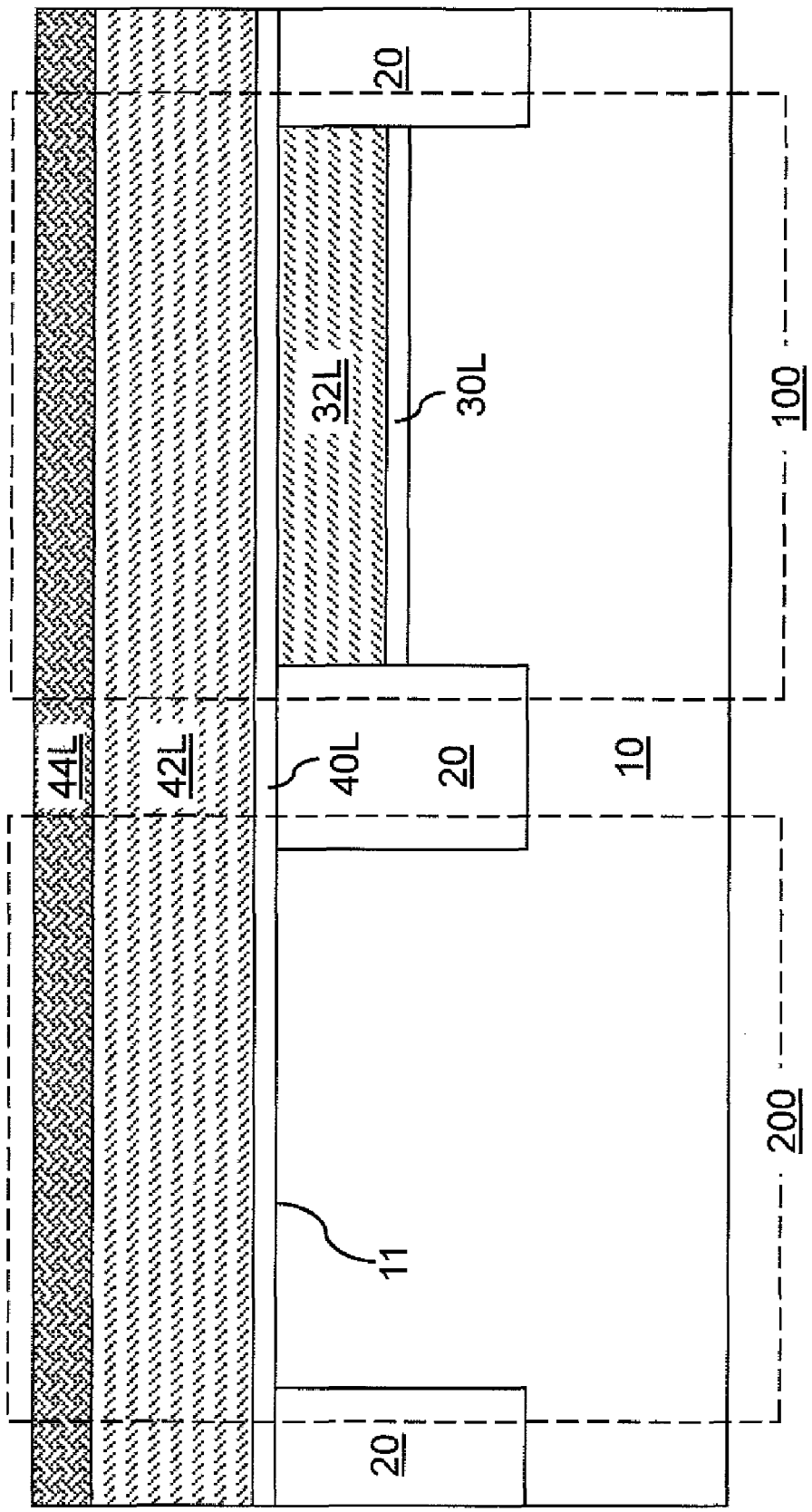

Referring to FIG. 5, a second gate dielectric layer 40L, a second gate conductor layer 42L, and a gate cap hard mask layer 44L are formed on the first top surface 11 of the semiconductor layer 10, the STI top surface, and the top surface of the first gate conductor layer 32L. The second gate dielectric layer 40L may comprise any of the material that may be employed as the material for first gate dielectric layer 30L, and may be formed by the same methods. The thickness of the second gate dielectric layer may be from about 3 nm to about 20 nm, and typically from about 5 nm to about 12 nm, although lesser and greater thicknesses area also contemplated herein.

Alternately, the second gate dielectric layer 40L may comprise a flash-memory-side second gate dielectric layer (not shown separately) formed in the first region 100 and a logic-side second gate dielectric layer (not shown separately) formed in the second region 200. Each of the flash-memory-side second gate dielectric layer and the logic-side second gate dielectric layer may be formed by deposition of a dielectric material layer followed by lithographic patterning so that the flash-memory-side second gate dielectric layer and the logic-side second gate dielectric layer have different thicknesses and/or different composition. Such differentiation of the composition and/or thickness between the flash-memory-side second gate dielectric layer and the logic-side second gate dielectric layer enables independent optimization of the second gate dielectric layer 40 for devices to be formed in the first region 100 and in the second region 200.

The second gate conductor layer 42L may comprise any of the material that may be employed as the material for first gate conductor layer 32L, and may be formed by the methods that may be employed to form the conductive material layer 31L. The thickness of the second gate conductor layer 42L may be from about 80 nm to about 1,000 nm, and typically from about 120 nm to about 400 nm n, although lesser and greater thicknesses are also contemplated herein.

The gate cap hard mask layer 44L comprises a dielectric material such as a dielectric nitride or a dielectric oxide. The gate cap hard mask layer 44L may comprise a single dielectric material layer or a plurality of dielectric material layers having different compositions. For example, the gate cap hard mask layer 44L may comprise silicon nitride or silicon oxide. The gate cap hard mask layer 44L may be formed by low pressure chemical vapor deposition (LPCVD), plasma enhanced chemical vapor deposition (PECVD), high density plasma chemical vapor deposition (HDPCVD), sub-atmospheric chemical vapor deposition (SACVD), etc. The thickness of the gate cap hard mask layer 44L may be from about 10 nm to about 300 nm, and typically from about 30 nm to about 100 nm n, although lesser and greater thicknesses are also contemplated herein. The entirety of the top surface of the gate cap hard mask layer 44L is planar.

Figure 6:
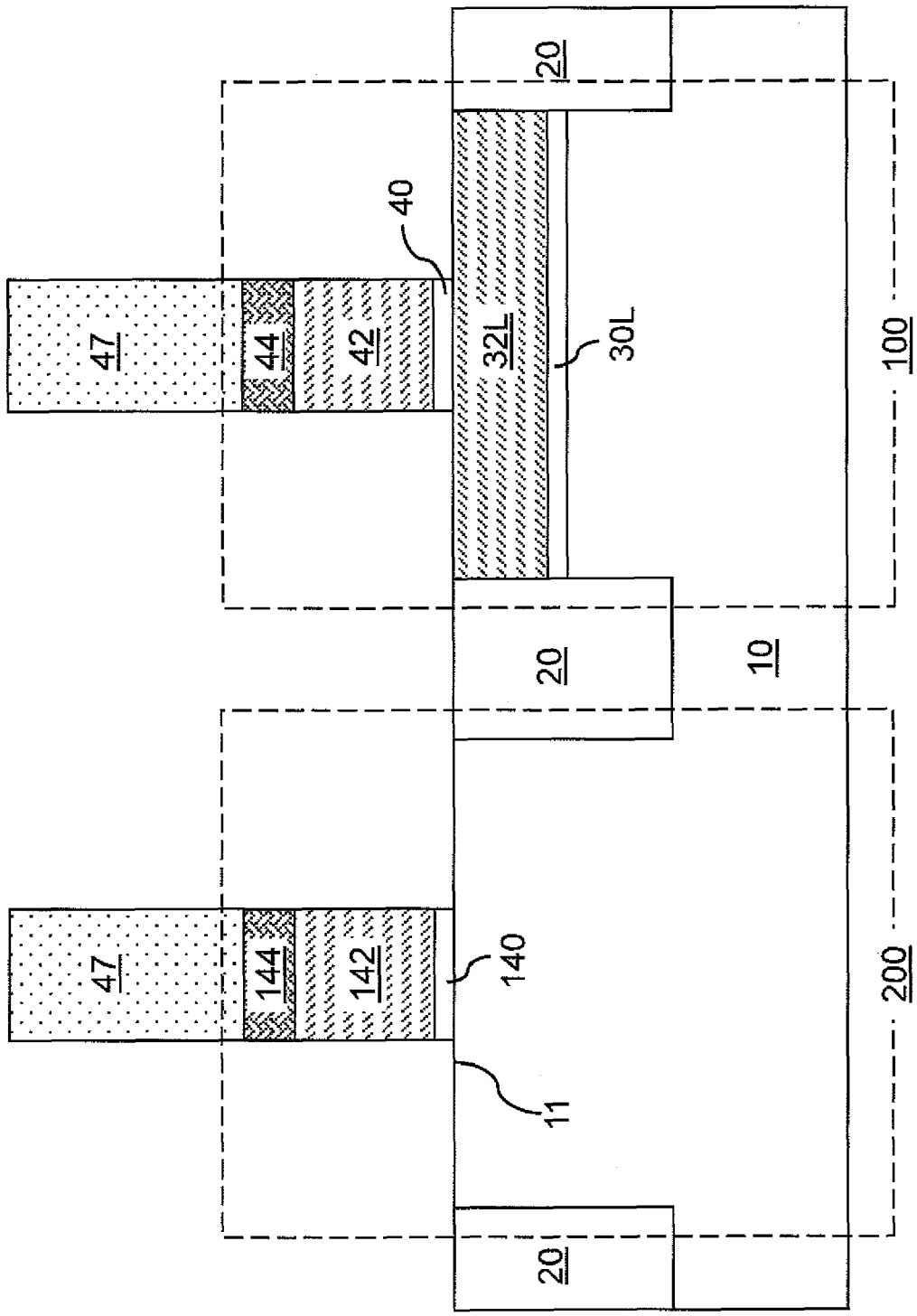

Referring to FIG. 6, a photoresist 47 is applied over the planar top surface of the gate cap hard mask layer 44L and lithographically patterned to form a pattern of a first gate conductor line in the first region 100 and a second gate conductor line in the second region 200. The pattern of the first gate conductor line straddles across the area of a middle portion of the first gate conductor layer 32L and portions of the at least one STI structure 20 that laterally abut the middle portion of the first gate conductor layer 32L in the first region. The pattern of the second gate conductor line straddles across a middle portion of the first top surface of the semiconductor layer 10 and portions of the at least one STI structure located directly thereupon in the second region 200. A full range of the focus of depth of the lithography process may be used as the process window of the lithography process that is employed to pattern the photoresist 47 because the entirety of the top surface of the gate cap hard mask layer 44L is planar. Thus, the planar topography of the top surface of the gate cap hard mask layer 44L improves manufacturability of the devices of the present invention, which include a flash memory device in the first region 100 and a MOSFET device in the second region 200.

An anisotropic etch is employed to transfer the pattern of the first and second gate conductor lines into the vertical stack of the gate cap hard mask layer 44L and the second gate conductor layer 42L. Another anisotropic etch or a wet etch may be employed to remove the exposed portions of the second gate dielectric layer 40L. Preferably, the other anisotropic etch or the wet etch is selective to the material of the semiconductor layer 10 and the material of the first gate conductor layer 32L.

A remaining portion of the gate cap hard mask layer 44L in the first region 100 constitutes a first gate cap hard mask portion 44, a remaining portion of the second gate conductor layer 42L in the first region 100 constitutes a first gate electrode 42, and a remaining portion of the second gate dielectric layer 40L in the first region 100 constitutes a second gate dielectric 40. A remaining portion of the gate cap hard mask layer 44L in the second region 200 constitutes a second gate cap hard mask portion 144, a remaining portion of the second gate conductor layer 42L in the second region 200 constitutes a second gate electrode 142, and a remaining portion of the second gate dielectric layer 40L in the second region 200 constitutes a third gate dielectric 140. The first top surface 11 of the semiconductor layer 10 is exposed outside the area of the stack of the third gate dielectric 140, the second gate electrode 142, and the second gate cap hard mask portion 144. Top surfaces of the first gate conductor layer 32L are exposed outside the area of the stack of the second gate dielectric 40, the first gate electrode 42, and the first gate cap hard mask portion 44. The photoresist 47 is subsequently removed.

Figure 7:
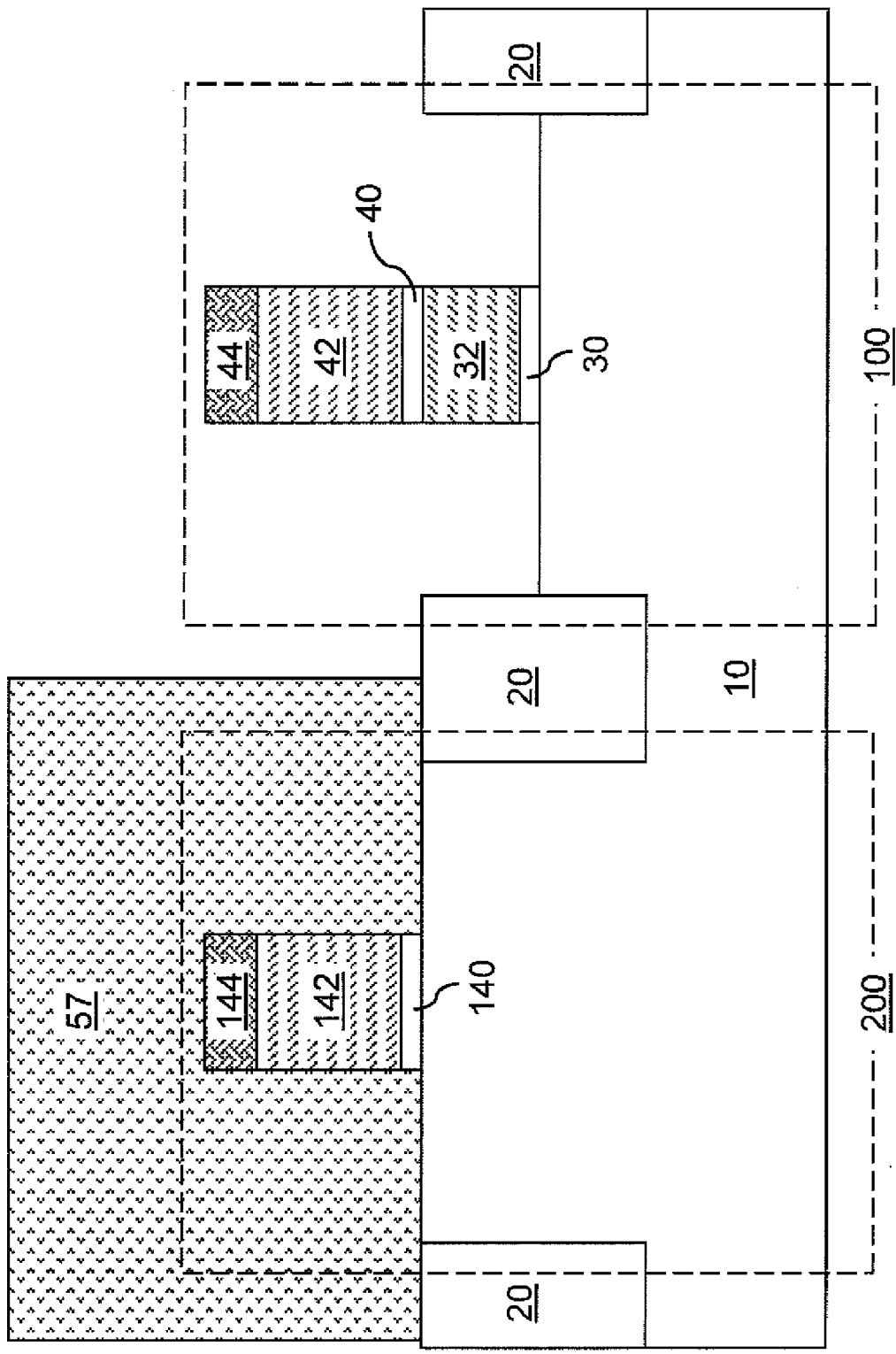

Referring to FIG. 7, a block level photoresist 57 is applied over the top side of the first exemplary semiconductor structure and lithographically patterned to cover the area of the second region 200, while exposing the area of the first region 100. Employing the combination of the block level photoresist 57, the first gate cap hard mask portion 44, and the at least one STI structure 20 as an etch mask, the pattern of the vertical stack of the second gate dielectric 40, the first gate electrode 42, and the first gate cap hard mask portion 44 is transferred into the first gate conductor layer 32L and the first gate dielectric layer 30L. An anisotropic etch is employed to pattern the first gate conductor layer 32L. Another etch, which may be another anisotropic etch or a wet etch, is employed to pattern the first gate dielectric layer 30L. Preferably, the etch is selective to the material of the semiconductor layer 10.

The remaining portion of the first gate conductor layer 32L constitutes a floating gate 32, and the remaining portion of the first gate dielectric layer 30L constitutes a first gate dielectric 30. The sidewalls of the first gate dielectric 30, the floating gate 32, the second gate dielectric 40, the first gate electrode 42, and the first gate cap hard mask portion 44 are substantially vertically coincident in the plane of the vertical cross-sectional view of FIG. 7. A pair of sidewalls of the floating gate 32 laterally abut the at least one STI structure.

Figure 8:
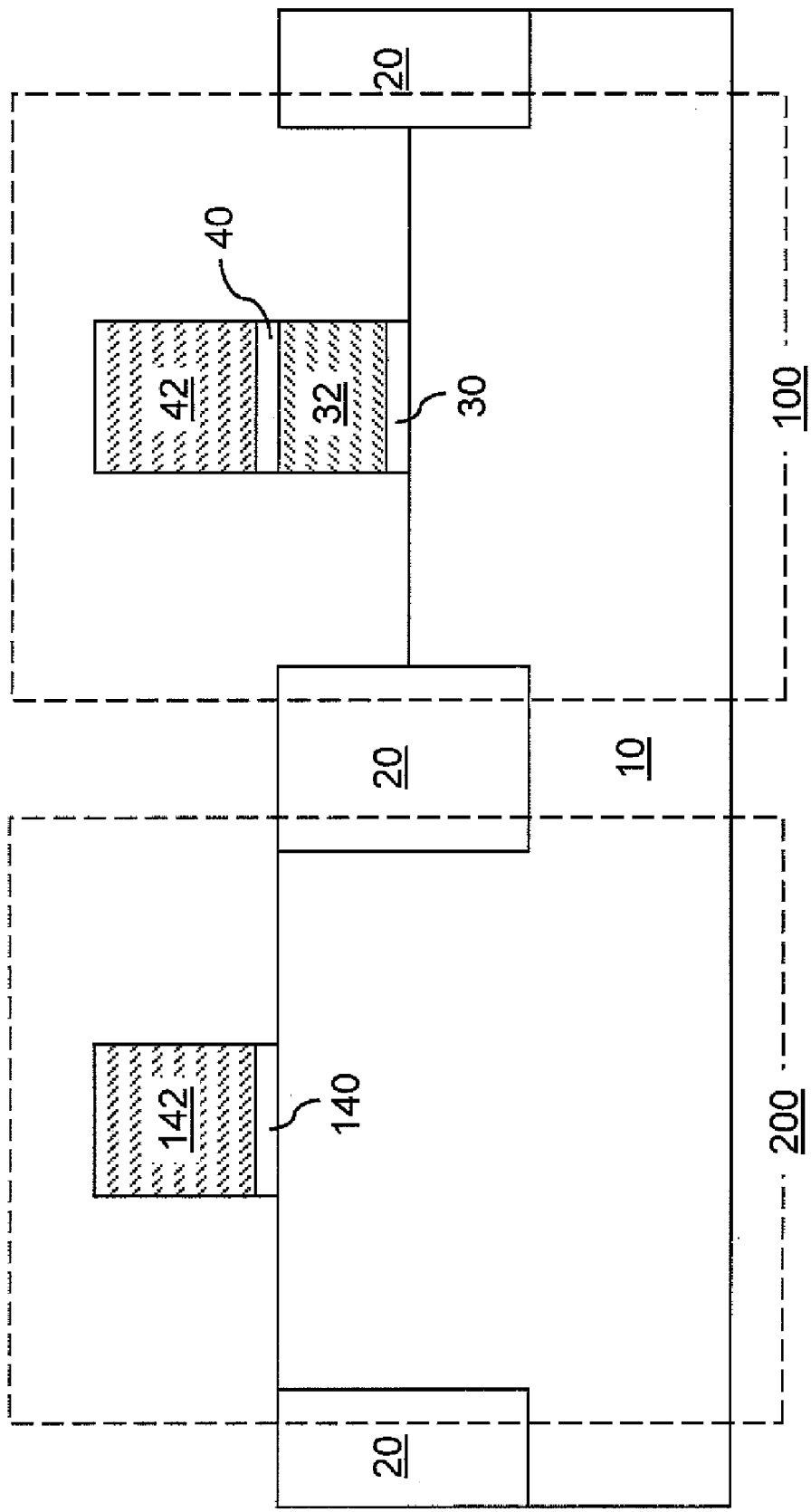

Referring to FIG. 8, the block level photoresist 57 is subsequently removed. The first gate cap hard mask portion 44 and the second gate cap hard mask portion 144 are also removed. Preferably, the removal of the first and second gate cap hard mask portions (44, 144) is selective to the materials of the first gate dielectric 30, the floating gate 32, the second gate dielectric 40, the first gate electrode 42, and the semiconductor layer 10. In case the first and second gate cap hard mask portions (44, 144) comprise silicon nitride, a wet etch employing hot phosphoric acid may be employed to remove the first and second gate cap hard mask portions (44, 144) selective to other elements in the first exemplary semiconductor structure.

Figure 9:
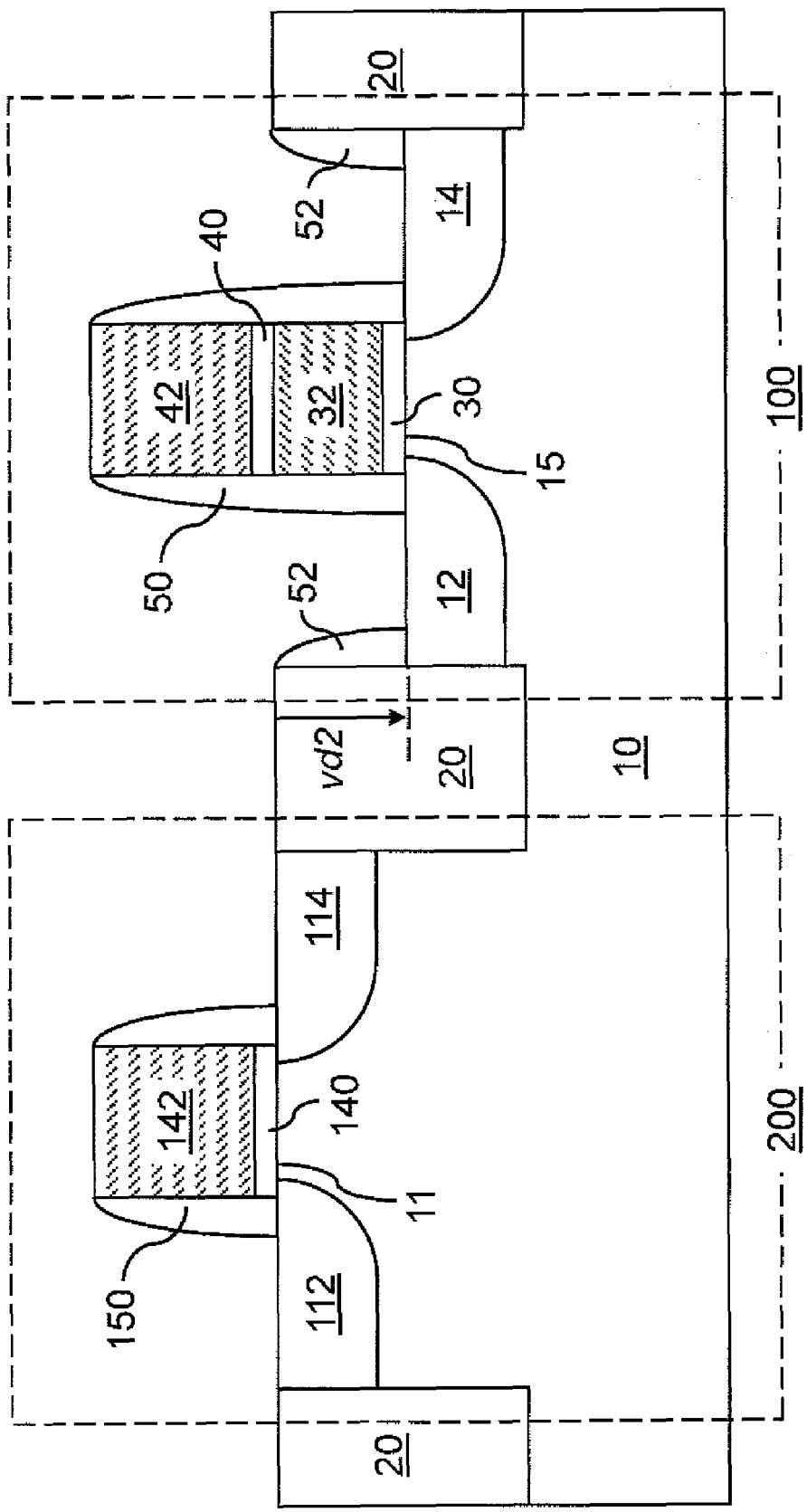

Referring to FIG. 9, dielectric gate spacers and dielectric STI spacers 52 are formed by deposition of a conformal dielectric material layer (not shown) and a subsequent anisotropic etch that removes horizontal portions of the conformal dielectric material layer. The remaining vertical portions of the conformal dielectric material layer constitute the dielectric gate spacers and dielectric STI spacers 52. The dielectric gate spacers and dielectric STI spacers may comprise a dielectric oxide, a dielectric nitride, or a combination thereof. A plurality of dielectric gate spacers and dielectric STI spacers 52 comprising different materials may be formed by employing multiple conformal dielectric material layers and multiple anisotropic etches.

The dielectric gate spacers include a first dielectric gate spacer 50 which laterally abuts the sidewalls of a vertical stack of the first gate dielectric 30, the floating gate 32, the second gate dielectric 40, and the first gate electrode 42. The first dielectric gate spacer 50 laterally surrounds the stack of the second gate dielectric 40 and the first gate electrode 42. Two end walls of the floating gate 30 laterally abut sidewalls of the at least one STI structure 20. The first dielectric gate spacer 50 abuts the second top surface 15 of the semiconductor layer 10. The dielectric gate spacers further include a second dielectric gate spacer 150 which laterally abuts and laterally surrounds the sidewalls of the vertical stack of the third gate dielectric 140 and the second gate electrode 142. The second dielectric gate spacer 150 abuts the first top surface 11 of the semiconductor layer 10.

The dielectric STI spacers 52 are formed directly on the exposed sidewalls of the at least one STI structure 20 in the first region 100. The dielectric STI spacers 52 include a source-side dielectric STI spacer located on one side of the vertical stack of the first gate dielectric 30, the floating gate 32, the second gate dielectric 40, and the first gate electrode 42, and a drain-side dielectric STI spacer located on the other side of the vertical stack of the first gate dielectric 30, the floating gate 32, the second gate dielectric 40, and the first gate electrode 42. The dielectric STI spacers 52 and the first dielectric gate spacer 50 are of integral and unitary construction, i.e., constitute a single contiguous structure without an interface therebetween.

The topmost portion of the first dielectric gate spacer 50 and the topmost portion of the second dielectric gate spacer 150 are at a same level i.e., located at a same vertical distance from the first top surface 11 of the semiconductor layer 10. Because the bottom surface of the first dielectric gate spacer 50 extends to the second top surface 15 of the semiconductor layer 10, while the bottom surface of the second gate dielectric layer extends to the first top surface 11 of the semiconductor layer 10, the vertical dimension of the first dielectric gate spacer 50 is greater than the vertical dimension of the second dielectric gate spacer 150 by the second vertical distance vd2.

Optionally, halo implantation and/or source and drain implantation may be performed to form halo regions (not shown) and/or source and drain extension regions (not shown) prior to formation of the dielectric gate spacers and dielectric STI spacers. After formation of the dielectric gate spacers and dielectric STI spacers, at least one source and drain ion implantation is performed to form source and drain regions.

The source and drain regions include a first source region 12 and a first drain region 14 located directly beneath the second top surface 15 of the semiconductor layer 10 in the first region 100 and a second source region 112 and a second drain region 114 located directly beneath the first top surface 11 of the semiconductor layer 10 in the second region 200. The bottom surfaces of the first and second source and drain regions (12, 14, 112, 114) are located above the level of the bottom surface of the at least one STI structure 20 to provide sufficient electrical isolation between adjacent devices.

Figure 10:
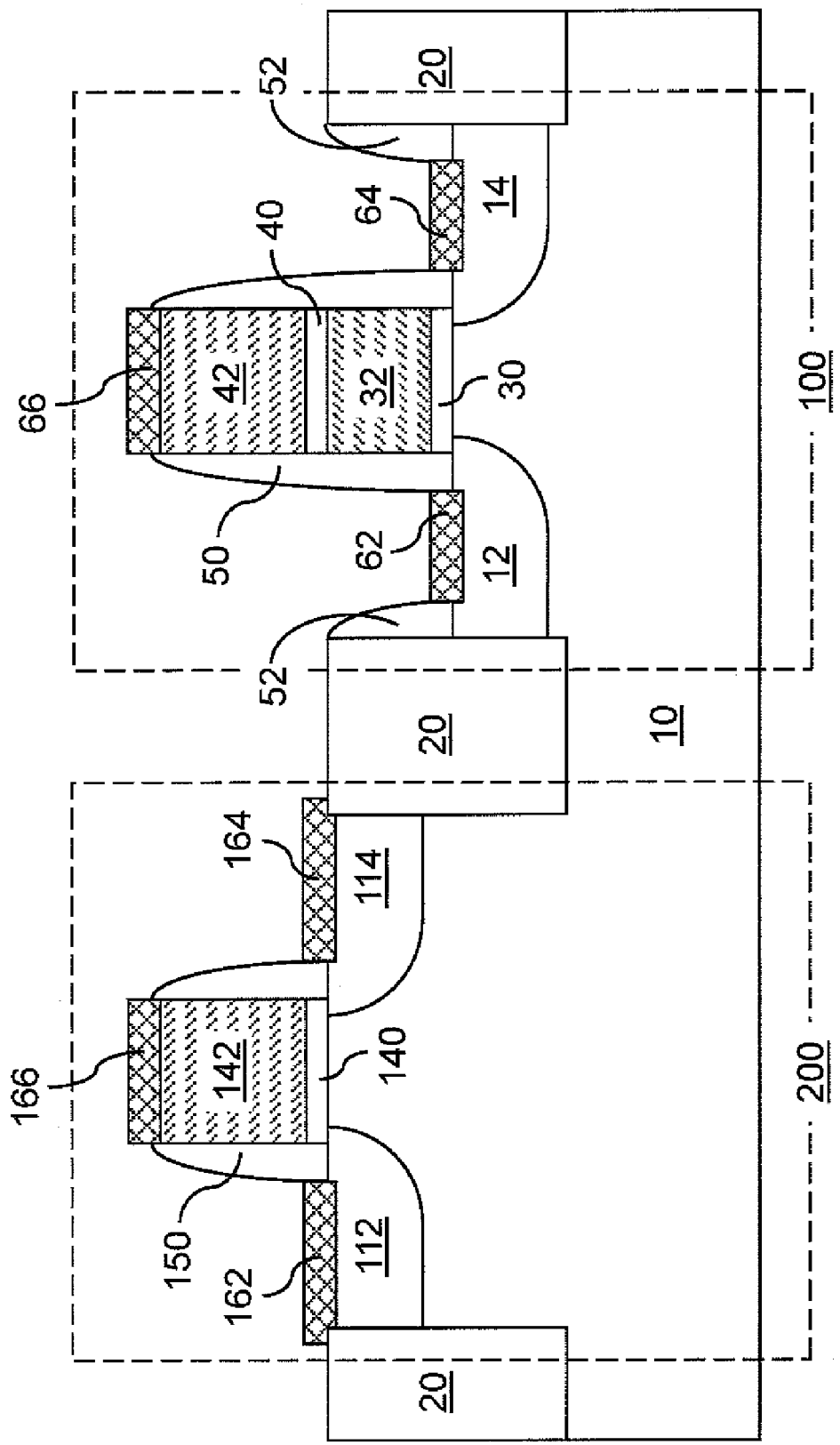
Figure 11:
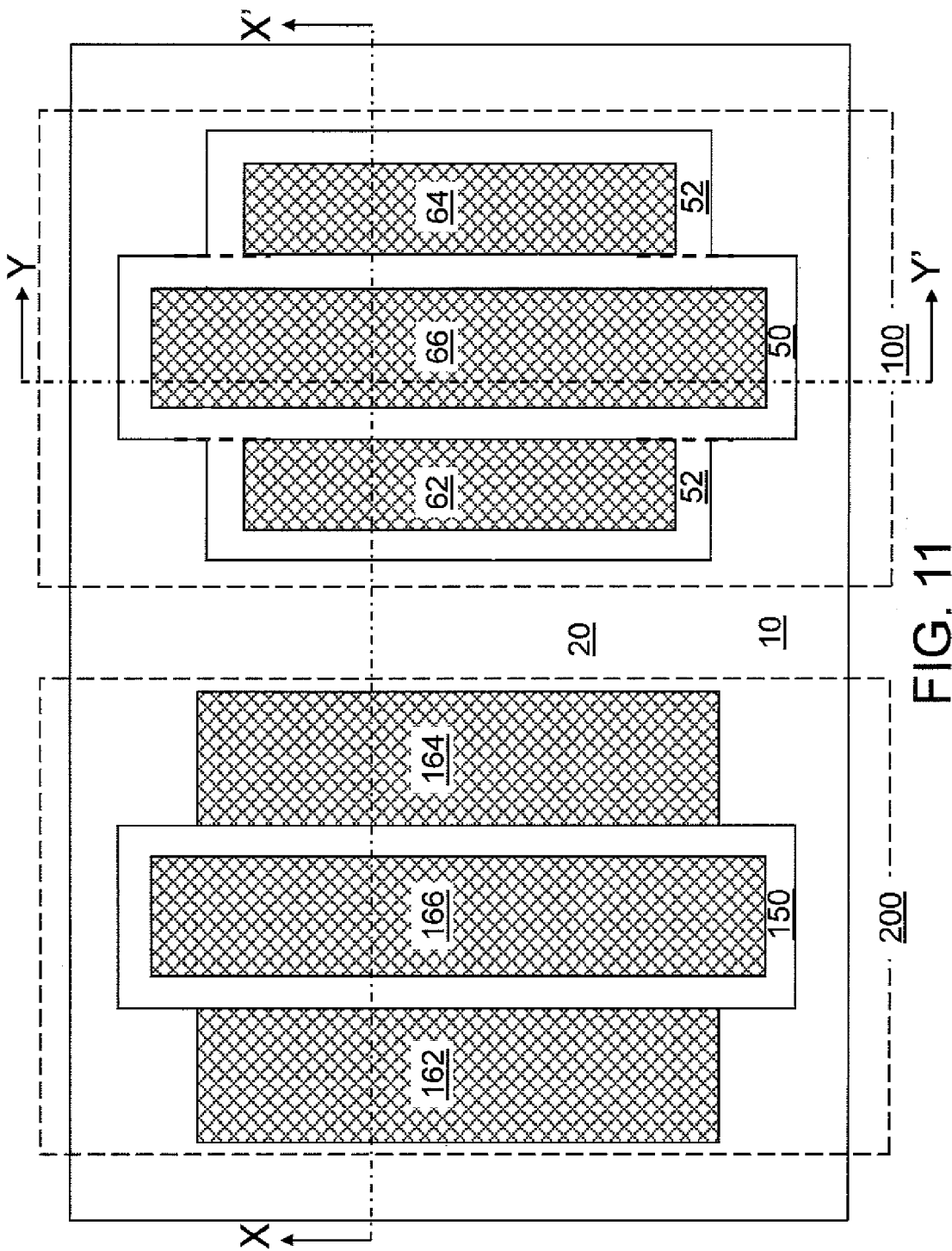
FIG. 11 is a top-down view of the first exemplary semiconductor structure of FIG. 10, which is the vertical cross-sectional view along the plane X-X' in FIG. 11.
Figure 12:
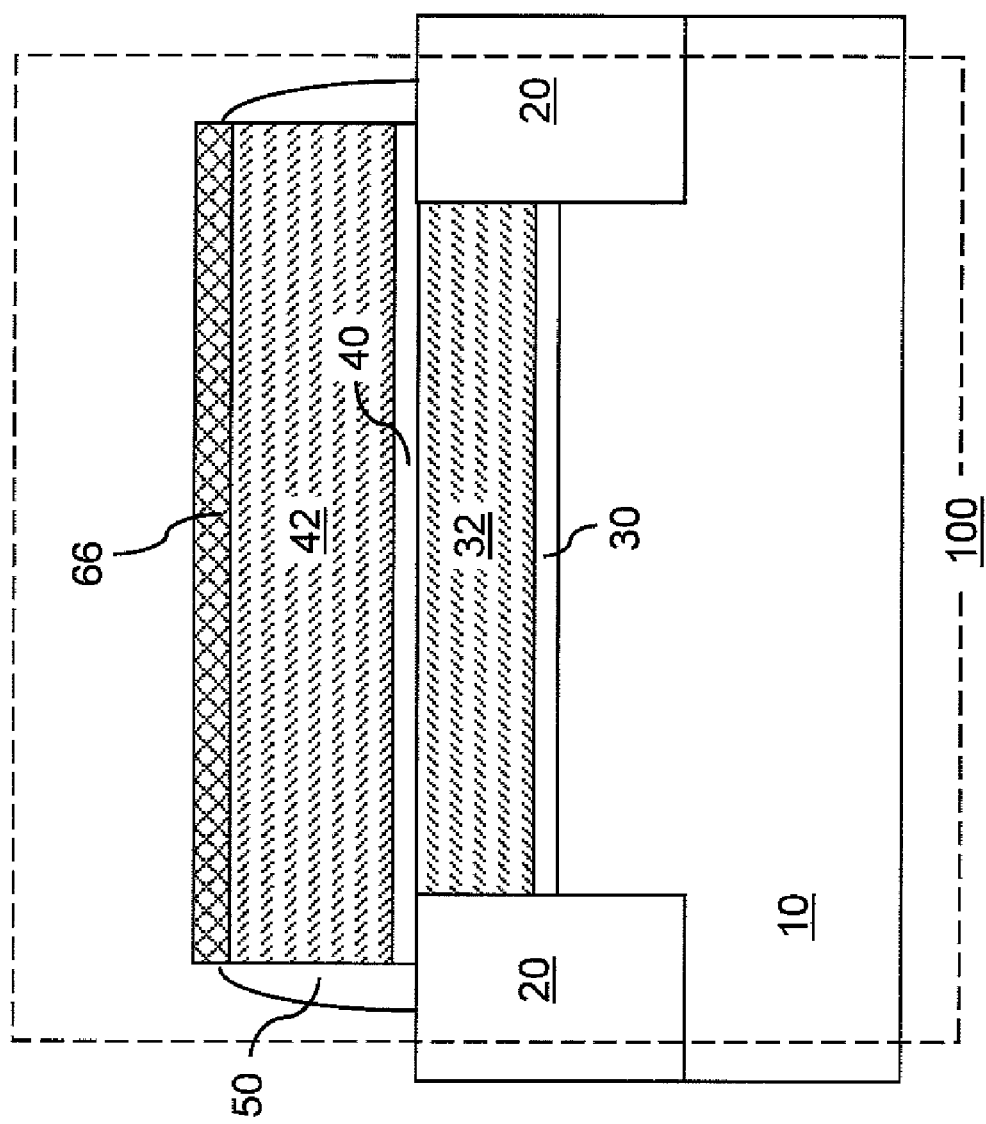
FIG. 12 is another vertical cross-sectional view of the first exemplary semiconductor structure of FIGS. 10 and 11 along the plane Y-Y' in FIG. 11.

Referring to FIGS. 10, 11, and 12, metal semiconductor alloy portions are formed on exposed semiconductor surfaces of the first exemplary semiconductor structure. FIG. 10 is a vertical cross-sectional view along the same vertical plane as the vertical planes of FIGS. 1-9. FIG. 11 is a top-down view. The plane of the vertical cross-sectional view of FIG. 10 is the plane labeled X-X'. FIG. 12 is a vertical cross-sectional view along the plane Y $Y_1$ in FIG. 11. The metal semiconductor alloy portions may be formed, for example, by deposition of a metal layer on the exposed semiconductor surfaces and reacting the metal layer with the semiconductor material underneath.

A first source-side metal semiconductor alloy portion 62 is formed directly on the exposed top surface of the first source region 12, and a first drain-side metal semiconductor alloy portion 64 is formed directly on the exposed top surface of the first drain region 14. A second source-side metal semiconductor alloy portion 162 is formed directly on the exposed top surface of the second source region 112, and a second drain-side metal semiconductor alloy portion 164 is formed directly on the exposed top surface of the second drain region 114. Since the first and second source-side and drain-side metal semiconductor alloy portions (62, 64, 162, 164) are derived from the material of the semiconductor layer 10 and the same metal layer, the first and second source-side and drain-side metal semiconductor alloy portions (62, 64, 162, 164) comprise the same metal semiconductor alloy material. In case the semiconductor layer 10 comprises silicon, the first and second source-side and drain-side metal semiconductor alloy portions (62, 64, 162, 164) comprise a metal silicide. In case the semiconductor layer 10 comprises a silicon-germanium alloy, the first and second source-side and drain-side metal semiconductor alloy portions (62, 64, 162, 164) comprise a metal germano-silicide. If the first gate electrode 42 and the second gate electrode 142 comprise a semiconductor material, a first gate-side metal semiconductor alloy portion 66 is formed directly on the first gate electrode 42, and a second gate-side metal semiconductor alloy portion 166 is formed directly on the second gate electrode 142.

The first dielectric gate spacer 50 and the source-side dielectric STI spacer, which is the dielectric STI spacer 52 located over the source region 12, laterally abuts and laterally surrounds the first source-side metal semiconductor alloy portion 62. The first dielectric gate spacer 50 and the drain-side dielectric STI spacer, which is the dielectric STI spacer 52 located over the drain region 14, laterally abuts and laterally surrounds the first drain-side metal semiconductor alloy portion 64. The first source-side and drain-side metal semiconductor ally portions (62, 64) do not abut the at least one STI structure 20. The second source-side and drain-side metal semiconductor ally portions (162, 164) abut the at least one STI structure 20. The boundaries between the dielectric gate spacer 50 and the dielectric STI spacers 52 are shown in dotted lines in FIG. 11.

Figure 13:
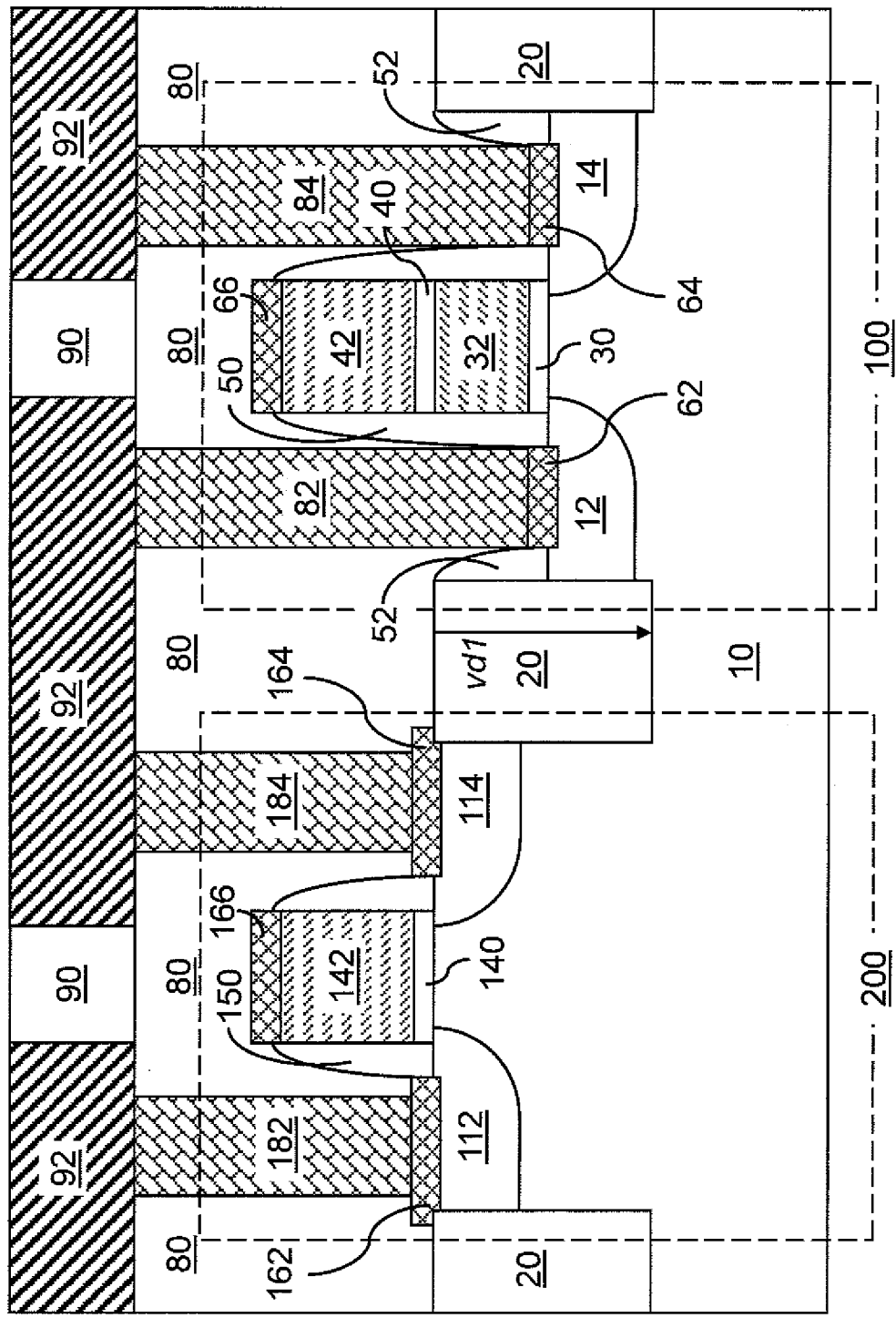

Referring to FIG. 13, a middle-of-line (MOL) dielectric layer 80 is formed over the various metal semiconductor alloy portions (62, 64, 66, 162, 164, 166), the first and second dielectric gate spacers (50, 150), the dielectric STI spacers 52, and the at least one STI structure 20. The MOL dielectric layer 80 may comprise a silicon oxide, a silicon nitride, a chemical vapor deposition (CVD) low-k dielectric material, a spin-on low-k dielectric material, or a stack thereof. The MOL dielectric layer 80 may contain a mobile ion diffusion barrier layer that prevents diffusion of mobile ions such as sodium and potassium from back-end-of-line (BEOL) dielectric layers. Further, the MOL dielectric layer 80 may contain a stress liner that applies tensile or compressive stress on underlying structures to alter charge carrier mobility in the channels (not shown) between the first source and drain regions (12, 14) and between the second source and drain regions (112, 114).

Contact via holes are formed in the MOL dielectric layer 80 and filled with a conductive material to form various conductive contacts. For example, a first source contact via 82 vertically abutting the first source-side metal semiconductor alloy portion 62 and a first drain-side contact via 84 vertically abutting the first drain-side metal semiconductor alloy portion 64 may be formed. Likewise, a second source contact via 182 vertically abutting the second source-side metal semiconductor alloy portion 162 and a second drain-side contact via 184 vertically abutting the second drain-side metal semiconductor alloy portion 164 may be formed. Further, gate contacts (not shown) may be formed directly on the first gate electrode 66 and the second gate electrode 166.

Exemplary conductive materials that may be employed for the various conductive contacts (82, 84, 182, 184) include doped polycrystalline or amorphous silicon, germanium, silicon germanium, a metal (e.g., tungsten, titanium, tantalum, ruthenium, cobalt, copper, aluminum, lead, platinum, tin, silver, gold), a conducting metallic compound material (e.g., tantalum nitride, titanium nitride, tungsten silicide, tungsten nitride, titanium nitride, tantalum nitride, ruthenium oxide, cobalt silicide, nickel silicide), carbon nanotube, conductive carbon, or any suitable combination thereof.

A wiring level dielectric material layer 90 may be formed above the MOL dielectric layer 80 and the various conductive contact vias (82, 84, 182, 184) to form metal lines 92 that provide electrical connection between the various conductive contact vias (82, 84, 182, 184) as needed. Thus, devices in the first region 100 and the second region 200 may be electrically connected.

The device in the first region 100 constitutes a flash memory device in which the floating gate 32 functions as a charge storage region. Additional flash memory devices may be formed in the first region to form a flash memory device array. The device in the second region 200 constitutes a MOSFET that may be employed to form a logic circuit such as a peripheral circuit for the flash memory device array or a logic core to which the flash memory device array is embedded in an SoC (system-on-a-chip) applications.

Figure 14:
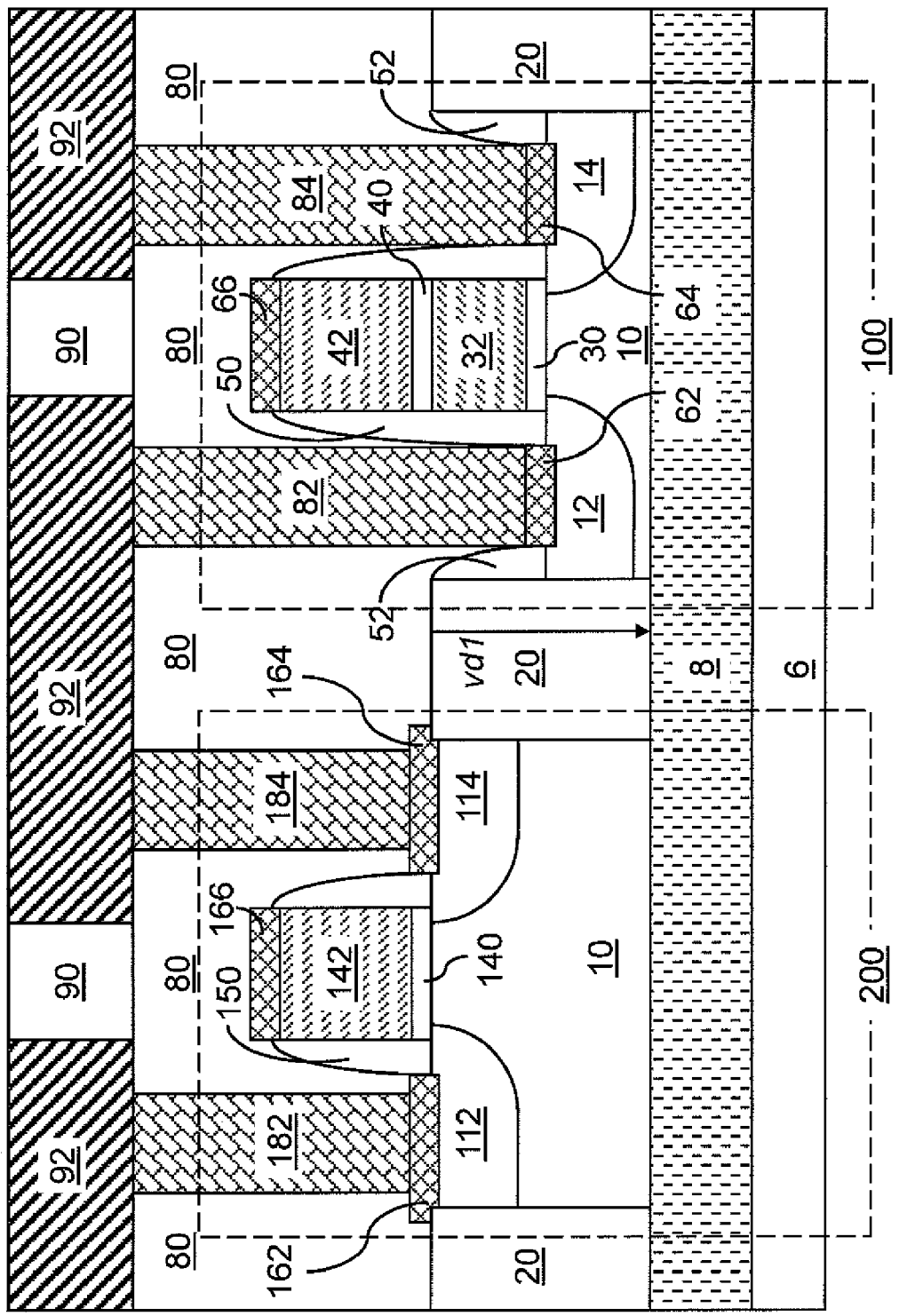
FIG. 14 is a vertical cross-sectional view of a second exemplary semiconductor structure according to a second embodiment of the present invention.

Referring to FIG. 14, a second exemplary semiconductor structure according to a second embodiment of the present invention employs a semiconductor-on-insulator (SOI) substrate. The second exemplary semiconductor structure may be formed by employing the SOI substrate instead of a bulk substrate and employing the same processing steps as in the first exemplary semiconductor structure of the first embodiment. The SOI substrate includes a handle substrate 6, a buried insulator layer 8, and a semiconductor layer 10. The semiconductor layer 10 of the second embodiment may comprise any of the semiconductor material that may be employed for the semiconductor layer 10 in the first embodiment. The stack of the handle substrate 6, the insulator layer 10, and the semiconductor fin 18 may be formed by patterning a top semiconductor layer of a semiconductor-on-insulator (SOD) substrate. The thickness of the semiconductor layer 10 is at least equal to the first vertical distance vd1. In one case, the thickness of the semiconductor layer 10 may be the same as the first vertical distance vd1.

The handle substrate 6 may comprise a semiconductor material, an insulator material, or a metallic material. For example, the handle substrate may comprise single crystalline semiconductor material such as silicon. The buried insulator layer 10 comprises a dielectric material such as silicon oxide or silicon nitride. The thickness of the buried insulator layer 10 may be from about 100 nm to about 2,000 nm, although lesser and greater thicknesses are also contemplated herein.

Figure 15:
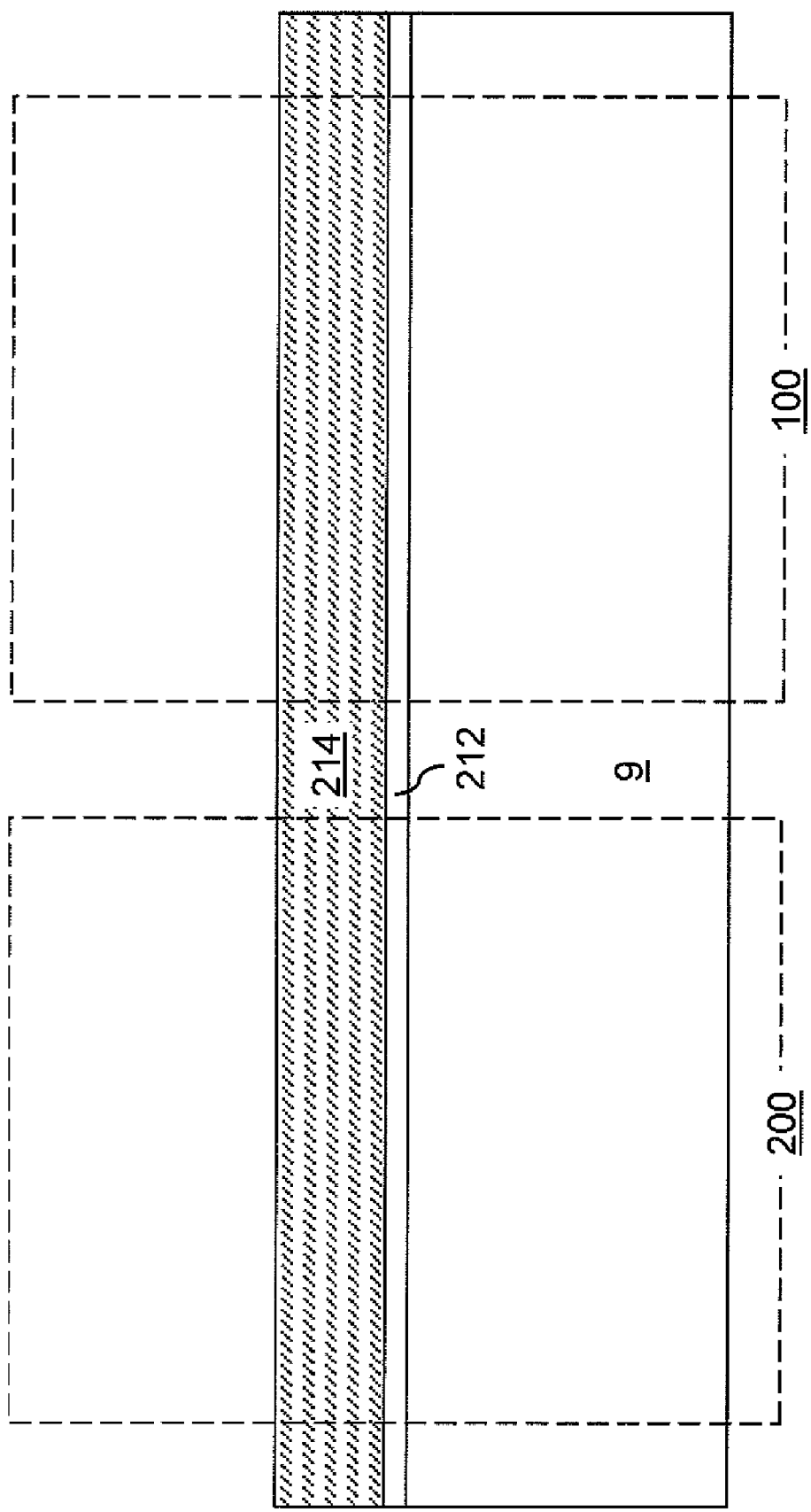
FIGS. 15-18 are sequential vertical cross-sectional views of a third exemplary semiconductor structure according to a third embodiment of the present invention.

Referring to FIG. 15, a third exemplary semiconductor structure according to a third embodiment of the present invention comprises a prototypical semiconductor layer 9, which may have the same composition as the semiconductor layer 10 of the first embodiment. Preferably, the prototypical semiconductor layer 9 comprises an epitaxial semiconductor material, i.e., the semiconductor material of the prototypical semiconductor layer 9 are epitaxially aligned in a crystal structure within the entirety of the prototypical semiconductor layer 9. A first region 100 and a second region 200 are provided in the third exemplary semiconductor structure.

A first pad dielectric layer 212 and a second pad dielectric layer 214 are formed on the top surface of the prototypical semiconductor layer 9. The first pad dielectric layer 212 and the second pad dielectric layer 214 comprise dielectric materials such as a dielectric oxide or a dielectric nitride. For example, the first pad dielectric layer 212 may comprise silicon oxide and the second pad dielectric layer 214 may comprise silicon nitride. The sum of the thickness of the first pad dielectric layer 212 and the thickness of the second pad dielectric layer 214 is comparable to the second vertical distance vd2 in the first exemplary semiconductor structure of the first embodiment (See FIG. 2).

Figure 16:
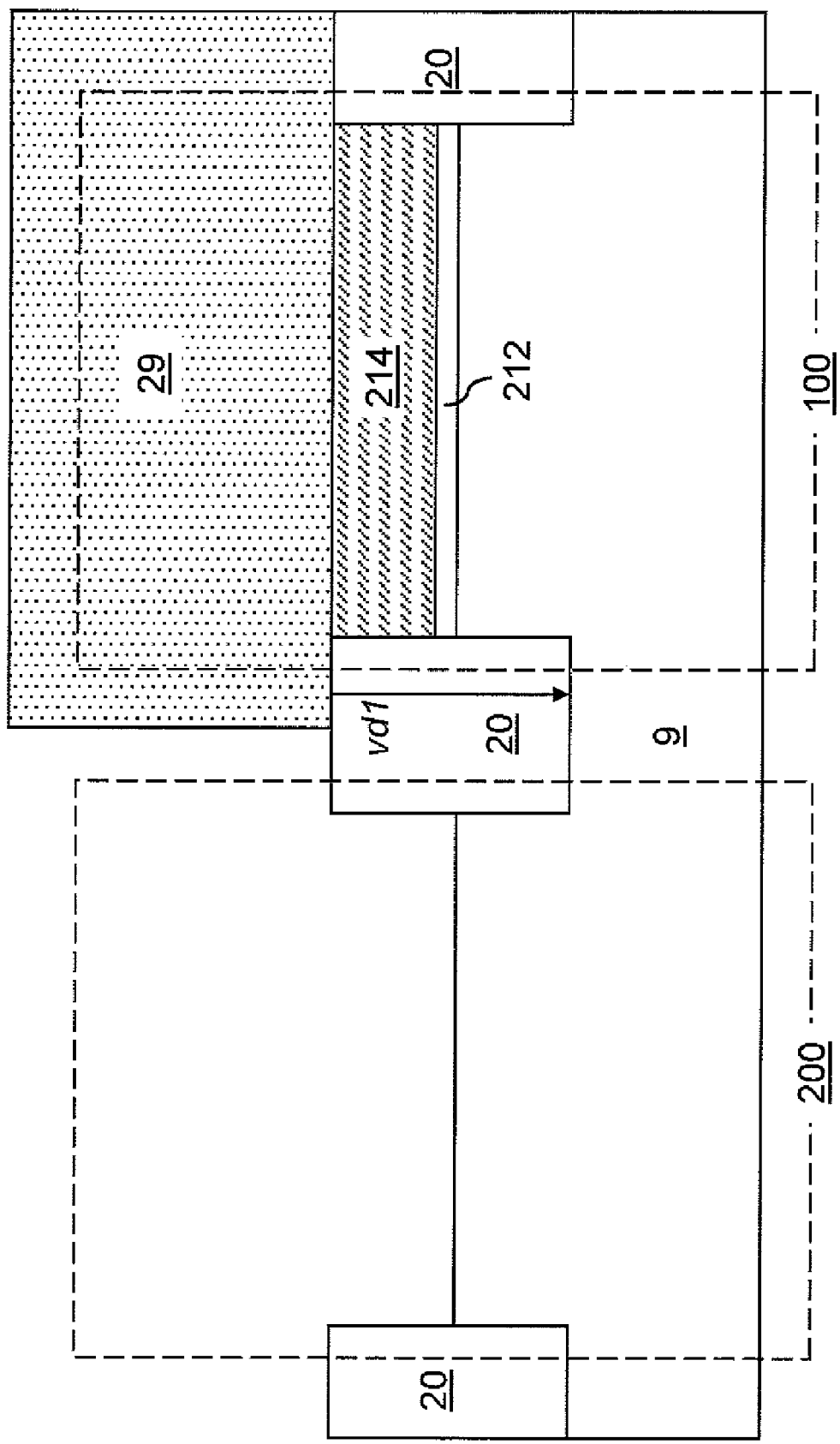

Referring to FIG. 16, at least one shallow trench isolation (STI) structure 20 is formed by forming trenches through the second and first pad dielectric layers (214, 212) and an upper portion of the prototypical semiconductor layer 9, followed by filling of the trenches with a dielectric material such as silicon oxide and planarizing the dielectric material. The remaining portions of the dielectric material within the trenches constitutes the at least one STI structure 20. The height of the at least one STI structure 20 is herein referred to as a first vertical dimension vd1, which may have the same range as in the first embodiment. An upper portion of the prototypical semiconductor layer 9 that is laterally surrounded by the at least one STI structure 20 is formed in the first region 100, and another upper portion of the prototypical semiconductor layer 9 that is laterally surrounded by the at least one STI structure 20 is formed in the second region 200.

A photoresist 29 is applied to the top surface of the second pad dielectric layer 214 and the top surfaces of the at least one STI region 20, and lithographically patterned to cover the area of the first region 100, while exposing the area of the second region 200. The portion of the second and first pad dielectric layers (214, 212) within the second region are removed by an etch, which may be a wet etch or a dry etch. The photoresist 29 is subsequently removed.

Figure 17:
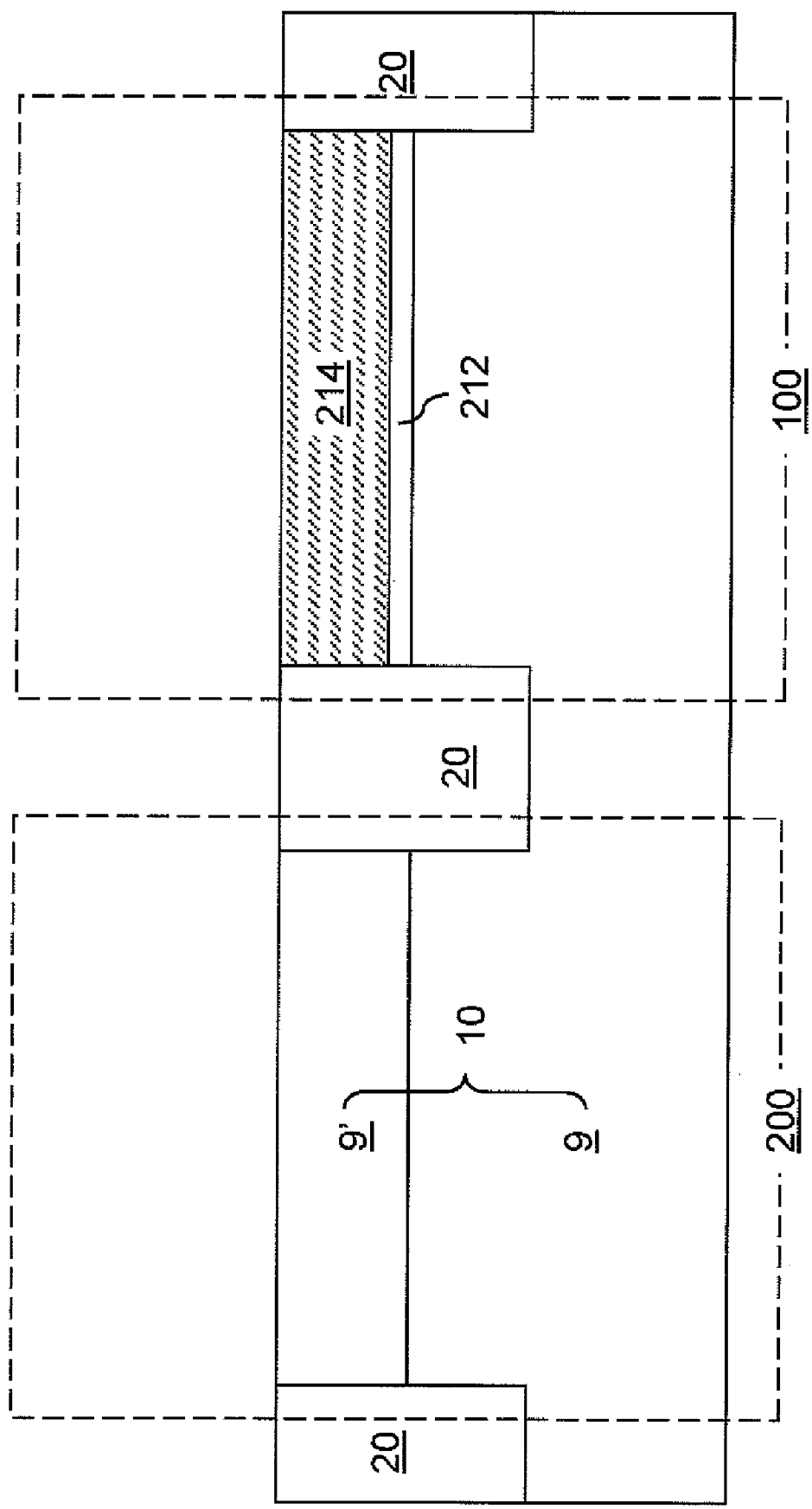

Referring to FIG. 17, a selective epitaxy of a semiconductor material is performed to grow an epitaxially grown semiconductor layer 9' directly on the top surface of the prototypical semiconductor layer 9 in the second region 200. In one case, the epitaxially grown semiconductor layer 9' comprises the same semiconductor material as the prototypical semiconductor layer 9. In another case, the epitaxially grown semiconductor layer 9' comprises a different semiconductor material than the semiconductor material of the prototypical semiconductor layer 9. The material of the epitaxially grown semiconductor layer 9' is selected so that the lattice mismatch between the different semiconductor materials is within a range that enables epitaxial alignment of semiconductor atoms across the interface between the prototypical semiconductor layer 9 and the epitaxially grown semiconductor layer 9'. The prototypical semiconductor layer 9 and the epitaxially grown semiconductor layer 9' collectively constitute a semiconductor layer 10. The top surface of the semiconductor layer 9' may protrude above the top surface of the pad layer 214 after epitaxy growth. In this case, excessive portion of the semiconductor layer 9' can be removed, for example, by chemical mechanical planarization (CMP).

Figure 18:
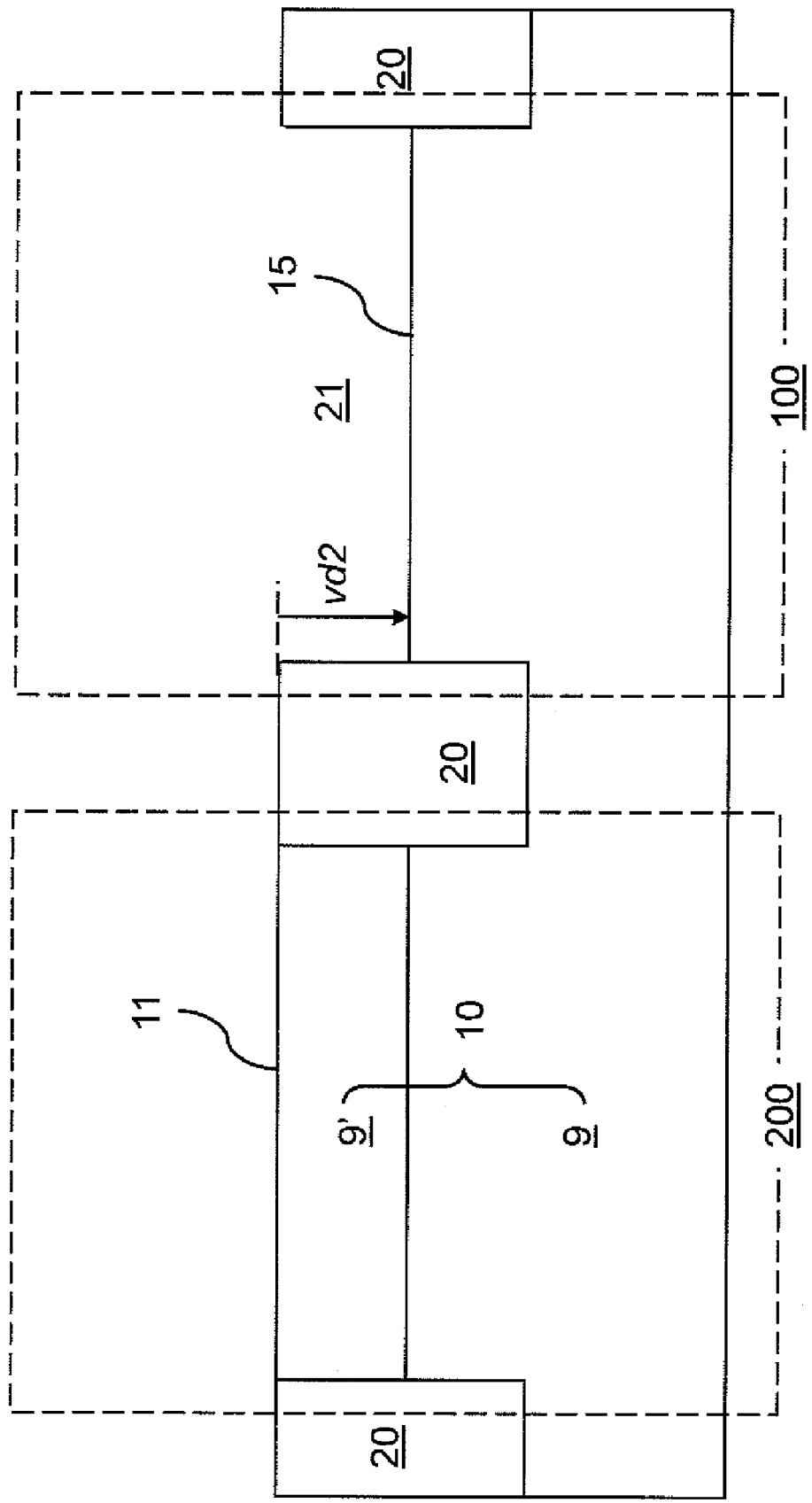

Referring to FIG. 18, the second pad dielectric layer 214 and the first pad dielectric layer 212 are removed from the first region by an etch, which may be a wet etch or a dry etch. Preferably, the etch is selective to the semiconductor materials of the prototypical semiconductor layer 9 and the epitaxially grown semiconductor layer 9' and the dielectric material of the at least one STI structure 20. A first top surface 11 of the semiconductor layer 10 is exposed in the second region 200, and a second top surface 15 of the semiconductor layer 10 is exposed underneath a cavity 21 in the first region 100. The first top surface 11 and the second top surface 15 of the semiconductor layer 10 are vertically offset by the second vertical distance vd2, which may have the same range as in the first embodiment.

Processing steps corresponding to FIGS. 3-13 of the first embodiment may be employed on the third exemplary semiconductor structure to form a same structure as the first exemplary semiconductor structure of FIG. 13.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   at least one shallow trench isolation (STI) structure having an STI top surface that is coplanar with a first top surface of a semiconductor substrate; and
   a transistor located on a second top surface of said semiconductor substrate and including a source region and a drain region located within said semiconductor substrate and a vertical stack of a first gate dielectric, a floating gate, a second gate dielectric and a gate electrode, wherein said vertical stack abuts said second top surface, and wherein a top surface of said floating gate is substantially coplanar with said first top surface.

2. The semiconductor structure of claim 1, wherein a bottom surface of said source region and a bottom surface of said drain region are located above a level of a bottom surface of said at least one STI structure.

3. The semiconductor structure of claim 1, further comprising a pair of dielectric STI spacers, each laterally abutting a sidewall of said at least one STI structure.

4. The semiconductor structure of claim 3, further comprising a dielectric gate spacer laterally abutting and laterally surrounding said vertical stack of said first gate dielectric, said floating gate, said second gate dielectric, and said gate electrode, wherein said dielectric gate spacer and said pair of dielectric STI spacers have a same composition.

5. The semiconductor structure of claim 4, wherein said dielectric gate spacer and said pair of dielectric STI spacers are of integral and unitary construction.

6. The semiconductor structure of claim 4, further comprising:
   a source-side metal semiconductor alloy portion vertically abutting said source region; and
   a drain-side metal semiconductor alloy portion vertically abutting said drain region, wherein said dielectric gate spacer and said pair of dielectric STI spacers laterally abut and laterally surround each of said source-side metal semiconductor alloy portion and said drain-side metal semiconductor alloy portion.

7. The semiconductor structure of claim 6, wherein said source-side metal semiconductor alloy portion and said drain-side metal semiconductor alloy portion are located underneath a level of said first top surface.

8. The semiconductor structure of claim 3, wherein a vertical distance between said top surface of said at least one STI structure and a bottom surface of said at least one STI surface is greater than the sum of a height of said pair of dielectric STI spacers and a thickness of said source region or said drain region.

9. The semiconductor structure of claim 1, wherein said floating gate comprises a doped semiconductor material or a metallic material, and said gate electrode comprises a doped semiconductor material or a metallic material, and said floating gate is electrically isolated from said substrate and said gate electrode.

10. The semiconductor structure of claim 1, further comprising another transistor located on said first top surface of said semiconductor substrate and including another source region and another drain region located within said semiconductor substrate and another vertical stack of a third gate dielectric and another gate electrode, wherein said other vertical stack abuts said first top surface.

11. The semiconductor structure of claim 10, wherein a top surface of said other gate electrode is substantially coplanar with a top surface of said gate electrode.

12. The semiconductor structure of claim 10, wherein said third gate dielectric and said second gate dielectric comprise a same material and have a same thickness, and wherein said other gate conductor and said gate conductor have a same material and have a same thickness.

13. The semiconductor structure of claim 10, further comprising:
- a first source-side metal semiconductor alloy portion vertically abutting said source region;
- a first drain-side metal semiconductor alloy portion vertically abutting said drain region;
- a second source-side metal semiconductor alloy portion vertically abutting said other source region; and
- a second drain-side metal semiconductor alloy portion vertically abutting said other drain region, wherein said first and second source-side semiconductor alloy portions and said first and second drain-side metal semiconductor alloy portions comprise a same metal semiconductor alloy material.

* * * * *